(12) United States Patent
Izuha et al.

(10) Patent No.: US 9,219,090 B2
(45) Date of Patent: Dec. 22, 2015

(54) SOLID-STATE IMAGE CAPTURING DEVICE AND ELECTRONIC DEVICE

(71) Applicant: Sony Corporation, Tokyo (JP)

(72) Inventors: Kyoko Izuha, Kanagawa (JP); Kouichi Harada, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 58 days.

(21) Appl. No.: 14/035,131

(22) Filed: Sep. 24, 2013

(65) Prior Publication Data

US 2014/0024164 A1    Jan. 23, 2014

Related U.S. Application Data

(63) Continuation of application No. 13/049,507, filed on Mar. 16, 2011, now Pat. No. 8,605,175.

(30) Foreign Application Priority Data

Mar. 31, 2010    (JP) ................. 2010-084035

(51) Int. Cl.
*H01L 21/00* (2006.01)
*H01L 27/146* (2006.01)

(52) U.S. Cl.
CPC .... *H01L 27/14625* (2013.01); *H01L 27/14621* (2013.01); *H01L 27/14685* (2013.01)

(58) Field of Classification Search
None
See application file for complete search history.

(56) References Cited

U.S. PATENT DOCUMENTS

| | | | |
|---|---|---|---|
| 3,397,023 A | 8/1968 | Land | |
| 3,459,889 A | 8/1969 | Friedrich et al. | |
| 3,479,936 A | 11/1969 | Land | |
| 3,971,065 A | 7/1976 | Bayer | |
| 5,255,088 A | 10/1993 | Thompson | |
| 5,302,818 A | 4/1994 | Pezant | |
| 5,581,300 A * | 12/1996 | Kim | 348/297 |
| 5,869,855 A | 2/1999 | Yoon et al. | |

(Continued)

FOREIGN PATENT DOCUMENTS

| | | |
|---|---|---|
| JP | 59-108466 | 6/1984 |
| JP | 01-236649 | 9/1989 |

(Continued)

OTHER PUBLICATIONS

Toshinori Otaka et al.; 12-Bit Column-Parallel ADC with Accelerated Ramp; IEEE Workshop on Charge-Coupled Devices and Advanced Images Sensors; 2005; pp. 173.

(Continued)

*Primary Examiner* — Calvin Choi
(74) *Attorney, Agent, or Firm* — Hazuki International, LLC

(57) ABSTRACT

A solid-state image capturing device including: a semiconductor substrate having a photosensitive surface including a matrix of pixels as respective photoelectric converters; and a photochromic film disposed in a light path through which light is applied to each of the photoelectric converters, the photochromic film being made of a photochromic material having a light transmittance variable depending on the intensity of applied light in a predetermined wavelength range; wherein the light transmittance has a half-value period shorter than one frame during which pixel signals generated by the pixels are read from all the pixels.

19 Claims, 28 Drawing Sheets

(56) References Cited

U.S. PATENT DOCUMENTS

| | | | |
|---|---|---|---|
| 6,130,448 | A | 10/2000 | Bauer et al. |
| 6,621,616 | B1 | 9/2003 | Bauer et al. |
| 6,833,873 | B1 | 12/2004 | Suda |
| 6,859,229 | B1 | 2/2005 | Suda |
| 6,882,368 | B1 | 4/2005 | Suda |
| 6,885,404 | B1 | 4/2005 | Suda |
| 6,980,248 | B1 | 12/2005 | Suda |
| 7,245,325 | B2 | 7/2007 | Yamaguchi |
| 7,619,680 | B1 | 11/2009 | Bingle et al. |
| 8,169,381 | B2 | 5/2012 | Tzschoppe et al. |
| 2002/0012064 | A1 | 1/2002 | Yamaguchi |
| 2005/0280602 | A1 | 12/2005 | Tzschoppe et al. |
| 2006/0290595 | A1* | 12/2006 | Takeuchi et al. ............ 345/55 |
| 2007/0133983 | A1 | 6/2007 | Traff |
| 2011/0141336 | A1 | 6/2011 | Mittleman |
| 2011/0285881 | A1 | 11/2011 | Izuha et al. |

FOREIGN PATENT DOCUMENTS

| | | |
|---|---|---|
| JP | 01-248542 | 10/1989 |
| JP | 04-065163 | 3/1992 |
| JP | 10-065129 | 3/1998 |
| JP | 2006-333439 | 12/2006 |
| JP | 2008-167004 | 7/2008 |

OTHER PUBLICATIONS

M. F. Snoeij et al.; A Low-Power Column-Parallel 12-bit ADC for CMOS Imagers; IEEE Workshop on Charge-Coupled Devices and Advanced Image Sensors; 2005; pp. 169.

Kishimoto, et al., "A Fast Photochromic Molecule That Colors Only under UV Light", published on the Internet on Mar. 10, 2009, American Chemical Society.

Sliwa, M., et al., "Design, Synthesis, Structural and Nonlinear Optical Properties of Photochromic Crystals: Toward Reversible Molecular Switches", published on the Internet on Aug. 6, 2005, American Chemical Society.

Fujita, K., et al., "Photochromism of a Radical Diffusion-Inhibited Hexaarylbiimidazole Derivative with Intense Coloration and Fast Decoloration Performance", published on the Internet on Jun. 19, 2008, American Chemical Society.

* cited by examiner

SOLID-STATE IMAGE CAPTURING DEVICE AND ELECTRONIC DEVICE

RELATED APPLICATION DATA

This application is a continuation of U.S. patent application Ser. No. 13/049,507 filed Mar. 16, 2011, the entirety of which is incorporated herein by reference to the extent permitted by law. The present application claims the benefit of priority to Japanese Patent Application No. JP 2010-084035 filed on Mar. 31, 2010 in the Japan Patent Office, the entirety of which is incorporated by reference herein to the extent permitted by law.

BACKGROUND OF THE INVENTION

1. Field of the Invention

The present invention relates to a solid-state image capturing device, a method of manufacturing such a solid-state image capturing device, a method of designing such a solid-state image capturing device, and an electronic device, and more particularly to a solid-state image capturing device having color filters of R (red), G (green), and B (blue), a method of manufacturing such a solid-state image capturing device, a method of designing such a solid-state image capturing device, and an electronic device.

2. Description of the Related Art

Electronic devices such as electronic digital video devices and electronic digital still devices have a solid-state image capturing device which may include a CCD (Charge Coupled Device) image sensor, a CMOS (Complementary Metal-Oxide-Silicon Transistor) image sensor, or the like.

The solid-state image capturing device includes a matrix of pixels arrayed in horizontal and vertical directions on a semiconductor substrate, providing a photosensitive surface. Each of the pixels on the photosensitive surface has a sensor including a photoelectric converter such as a photodiode, for example.

The solid-state image capturing device also includes a light condensing structure disposed above the photosensitive surface for condensing the light of a subject image onto the sensors of the pixels. The sensors detect the condensed light of the subject image and photoelectrically converts the detected light into signal charges, generating a pixel signal.

With the CCD image sensors and CMOS image sensors according to the related art, the photodiodes photoelectrically convert the light applied to the sensors into signal charges to be output as an image signal. Specifically, the CCD image sensors and CMOS image sensors convert the light that is applied to the sensors during a certain exposure time into signal charges and store the signal charges.

Since the amount of signal charges that can be stored is limited, when intensive light is applied to the sensors, they tend to be saturated making white and black gradation levels insufficient. Stated otherwise, though the solid-state image capturing device has a certain range of incident light intensity levels for producing appropriate output signals, the range of incident light intensity levels is very small compared with the range of light intensity levels emitted from the subject to be imaged.

There have been demands in the art for technologies for expanding the dynamic range of solid-state image capturing devices.

Some technologies that have been proposed in the art for expanding the dynamic range of solid-state image capturing devices will be described below. M. F. Snoeij, et. al., "A Low-Power Column-Parallel 12-bit ADC or CMOS imagers," 2005 IEEE Workshop on Charge-Coupled Devices and Advanced Image Sensors, pp. 169 and T. Otaka, et. al., "12-Bit Column-parallel ADC with Accelerated Ramp," 2005 IEEE Workshop on Charge-Coupled Devices and Advanced Image Sensors, pp. 173 discloses a technology for changing intervals at which applied light is photoelectrically converted depending on the intensity of the applied light. Japanese Patent Laid-open No. 2008-167004 discloses a technology for setting a gain depending on the intensity of applied light.

Japanese Patent Laid-open No. 2006-333439 discloses a solid-state image capturing device including light-shielding members for shielding photoelectric converters from light and actuators, constructed according to the MEMS (Micro-ElectroMechanical System) technology, for actuating the light-shielding members.

There has also been proposed a material-based approach to expand the dynamic range of solid-state image capturing devices, instead of the above device-oriented technologies for expanding the dynamic range of solid-state image capturing devices.

Japanese Patent Laid-open Nos. Hei 1-248542 and Hei 10-65129 disclose a process for expanding the dynamic range of a solid-state image capturing device by modulating light with either a material applied to a glass surface of the casing of the solid-state image capturing device or a material disposed between the glass surface and the solid-state image capturing device.

Japanese Patent Laid-open No. Hei 1-236649 discloses a process for expanding the dynamic range of a solid-state image capturing device by modulating light with a material grown as a film in front of the sensors.

Japanese Patent Laid-open No. Hei 4-65163 discloses a process for applying a photochromic material to a surface outside of photodiodes.

Problems that cannot be solved by the above disclosed technologies according to the related art include a time shift that occurs when a moving image is captured or when images are captured in succession. Specifically, solid-state image capturing devices of the readout type suffer a time shift at the time image data are read out a plurality of times and also at the time longer and shorter electric charges are stored, and solid-state image capturing devices incorporating a mechanical shutter suffer a position-depending time shift. Accordingly, images captured by those solid-state image capturing devices are not completely free of some oddities.

The material-based technologies described above have been difficult to incorporate into solid-state image capturing devices because specifications that are determined by the signal processing speed of the solid-state image capturing devices are not satisfied by the response speed of photochromism.

SUMMARY OF THE INVENTION

There is a need for the present invention to provide a solid-state image capturing device and an electronic device which are capable of expanding a dynamic range thereof without causing oddities in images captured thereby.

According to an embodiment of the present invention, there is provided a solid-state image capturing device including a semiconductor substrate having a photosensitive surface including a matrix of pixels as respective photoelectric converters, and a photochromic film disposed in a light path through which light is applied to each of the photoelectric converters, the photochromic film being made of a photochromic material having a light transmittance variable depending on the intensity of applied light in a predetermined wavelength range, wherein the light transmittance has a half-value period shorter than one frame during which pixel signals generated by the pixels are read from all the pixels.

As described above, the solid-state image capturing device according to the embodiment of the present invention includes a semiconductor substrate having a photosensitive surface including a matrix of pixels as respective photoelectric converters, and in a region of the photosensitive surface which includes at least some of the pixels, a photochromic film disposed on the semiconductor substrate in a light path through which light is applied to each of the photoelectric converters, the photochromic film being made of a photochromic material having a light transmittance variable depending on the intensity of applied light in a predetermined wavelength range. The light transmittance has a half-value period shorter than one frame during which pixel signals generated by the pixels are read from all the pixels.

According to another embodiment of the present invention, there is also provided an electronic device including a solid-state image capturing device including an image capturing unit, an optical system for guiding incident light to the image capturing unit of the solid-state image capturing device, and a signal processing circuit for processing an output signal from the solid-state image capturing device, wherein the solid-state image capturing device includes a semiconductor substrate having a photosensitive surface including a matrix of pixels as respective photoelectric converters, and a photochromic film disposed in a light path through which light is applied to each of the photoelectric converters the photochromic film being made of a photochromic material having a light transmittance variable depending on the intensity of applied light in a predetermined wavelength range, wherein the light transmittance has a half-value period shorter than one frame during which pixel signals generated by the pixels are read from all the pixels.

As described above, the electronic device according to the another embodiment of the present invention includes a solid-state image capturing device including an image capturing unit, an optical system for guiding incident light to the image capturing unit of the solid-state image capturing device, and a signal processing circuit for processing an output signal from the solid-state image capturing device. The solid-state image capturing device includes a semiconductor substrate having a photosensitive surface including a matrix of pixels as respective photoelectric converters, and in a region of the photosensitive surface which includes at least some of the pixels, a photochromic film disposed on the semiconductor substrate in a light path through which light is applied to each of the photoelectric converters, the photochromic film being made of a photochromic material having a light transmittance variable depending on the intensity of applied light in a predetermined wavelength range. The light transmittance has a half-value period shorter than one frame during which pixel signals generated by the pixels are read from all the pixels.

With the solid-state image capturing device according to the embodiment of the present invention, since the photochromic film is made of a photochromic material whose light transmittance half-value period is shorter than one frame of the solid-state image capturing device, the solid-state image capturing device has an expanded dynamic range and can generate images free of oddities.

With the electronic device according to the embodiment of the present invention, since the photochromic film of the solid-state image capturing device incorporated in the electronic device is made of a photochromic material whose light transmittance half-value period is shorter than one frame of the solid-state image capturing device, the solid-state image capturing device has an expanded dynamic range and can generate images free of oddities.

DETAILED DESCRIPTION OF THE PREFERRED EMBODIMENTS

Figure 1:
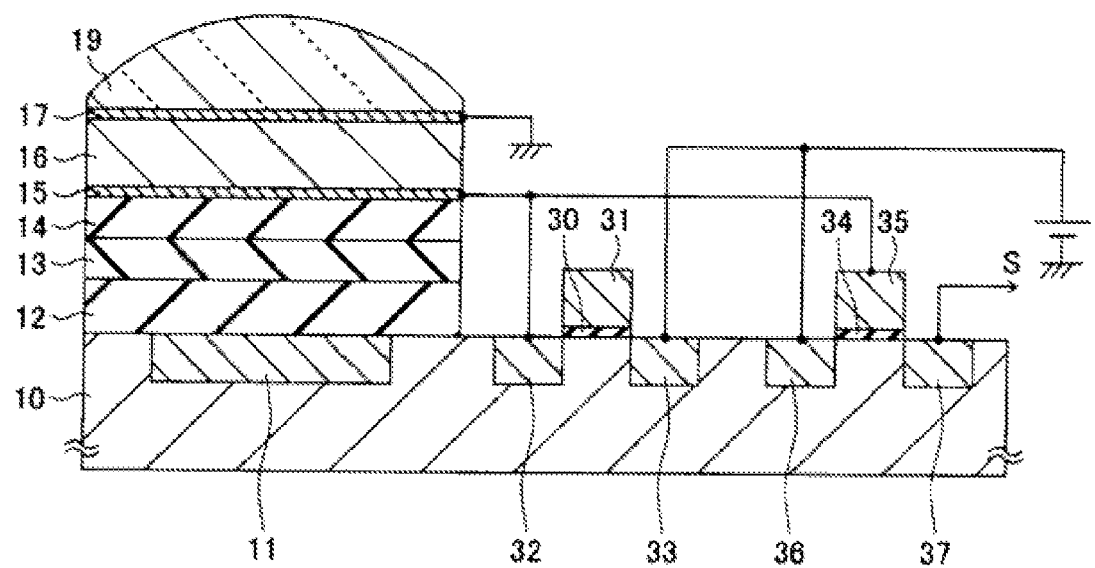
FIG. 1 is a schematic cross-sectional view of a solid-state image capturing device according to a first embodiment of the present invention.

Identical or corresponding parts are denoted by identical or corresponding reference characters throughout views.

Solid-state image capturing device and electronic devices according to preferred embodiments of the present invention will be described in detail below with reference to the drawings.

The embodiments of the present invention will be described below in the following order:

1. First embodiment (an arrangement having a photochromic film and a light amount measuring unit);
2. Second embodiment (an arrangement having color filters, a photochromic film, and a light amount measuring unit);
3. Third embodiment (an arrangement having photochromic films of different materials for respective pixel colors and a light amount measuring unit);
4. Fourth embodiment (an arrangement having photochromic films of different thicknesses for respective pixel colors and a light amount measuring unit);
5. Fifth embodiment (an arrangement having color filters and a photochromic film disposed in one layer);
6. Sixth embodiment (a layout of a photochromic film with respect to pixels);
7. Seventh embodiment (an arrangement that is devoid of a resetting unit of the first embodiment);
8. Eighth embodiment (an arrangement that is devoid of a resetting unit of the second embodiment);
9. Ninth embodiment (an arrangement that is free of a light amount measuring unit of the first embodiment);
10. Tenth embodiment (an arrangement that is free of a light amount measuring unit of the second embodiment);
11. Eleventh embodiment (an arrangement that is free of a light amount measuring unit of the third embodiment);
12. Eleventh embodiment (an arrangement that is free of a light amount measuring unit of the fourth embodiment);
13. Eleventh embodiment (an arrangement that is free of a light amount measuring unit of the fifth embodiment);
14. Fourteenth embodiment (applied to an electronic device).

<First Embodiment>
[Arrangement of Solid-state Image Capturing Device]

FIG. 1 is a schematic cross-sectional view of a solid-state image capturing device according to a first embodiment of the present invention.

As shown in FIG. 1, the solid-state image capturing device includes a matrix of pixels disposed on a semiconductor substrate 10, providing a photosensitive surface. Each of the pixels on the photosensitive surface has a photodiode 11 as a photoelectric converter. In FIG. 1, only one pixel is illustrated.

The pixel on the photosensitive surface will be described in detail below.

The photosensitive surface provided on the semiconductor substrate 10 by the photodiode 11 is covered with a first insulating film 12 made of silicon oxide, silicon nitride, or resin, or stacked layers of silicon oxide, silicon nitride, and resin, for example.

The first insulating film 12 is covered with a second insulating film 13 made of silicon oxide nitride, for example.

The second insulating film 13 is covered with a third insulating film 14 made of silicon nitride, for example.

The third insulating film 14 is covered with a stacked assembly of a lower electrode 15, a photochromic film 16, and an upper electrode 17, for example. The lower electrode 15, the photochromic film 16, and the upper electrode 17 are provided in a region of the photosensitive surface which includes at least some of the pixels.

The photochromic film 16 is disposed in a light path through which light is applied to the photodiode 11. The photochromic film 16 is made of a photochromic material whose light transmittance varies depending on the intensity of applied light in a predetermined wavelength range.

FIG. 1 illustrates a device structure wherein the photochromic material of the photochromic film 16 has a photoelectric converter function. Specifically, the photochromic film 16 photoelectrically converts light that is applied thereto into electric charges. The amount of the generated electric charges is monitored with the lower and upper electrodes 15, 17. The lower and upper electrodes 15, 17 include transparent electrodes made of ITO (indium tin oxide), for example.

An on-chip lens 19 is disposed on the upper electrode 17.

As described above, the photochromic material of the photochromic film 16 has its light transmittance variable depending on the intensity of applied light in a predetermined wavelength range.

Figure 2:
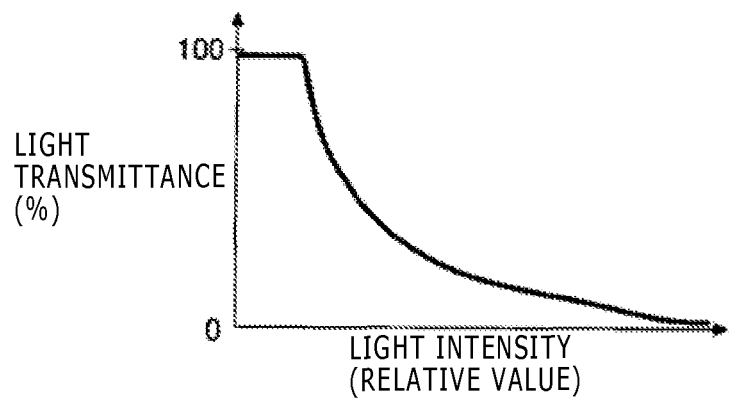
FIG. 2 is a graph showing the light transmittance characteristics of a photochromic film of the solid-state image capturing device according to the first embodiment of the present invention.

FIG. 2 is a graph showing the light transmittance characteristics of the photochromic film 16 of the solid-state image capturing device according to the first embodiment of the present invention. The graph shown in FIG. 2 has a vertical axis representing the light transmittance (%) and a horizontal axis the light intensity (relative value).

For example, the light transmittance of the photochromic film 16 varies depending on the intensity of applied light in a visible light range. In the visible light range, the light transmittance of the photochromic film 16 goes higher as the amount of applied light becomes smaller, and goes lower as the amount of applied light becomes greater. In addition, the light transmittance of the photochromic film 16 in the visible light range varies continuously depending on the amount of applied light.

When light is applied to the photochromic film 16, its light transmittance is lowered. When the light applied to the photochromic film 16 is blocked, its light transmittance recovers its original level. A period of time which the photochromic film 16 takes to recover one-half of the change in its light transmittance from the level at the time the applied light is blocked is referred to as "half-value period."

According to the present embodiment, the half-value period of the light transmittance of the photochromic film 16 is shorter than a period of time during which pixel signals generated by the pixels are read from all the pixels, i.e., one frame of the solid-state image capturing device.

For example, if the solid-state image capturing device has a frame rate of 60 fps, then one frame is of about 17 ms. In this case, a photochromic material whose half-value period is shorter than 17 ms is selected to make up the photochromic film 16.

For example, the photochromic film 16 should preferably be made of hexarylbisimidazole derivative.

With the solid-state image capturing device according to the first embodiment, the light transmittance of the photochromic film 16 varies depending on the amount of light applied thereto such that the light transmittance is lower as the intensity of applied light is higher and is higher as the intensity of applied light is lower. Therefore, a higher amount of applied light is required to saturate the output signal generated by the photodiode 11, allowing the photodiode 11 to have an expanded dynamic range at a higher light intensity level.

FIGS. 3A through 3D are diagrams showing output signals from the pixels of different solid-state image capturing devices including the solid-state image capturing device according to the first embodiment of the present invention.

Figure 3A:
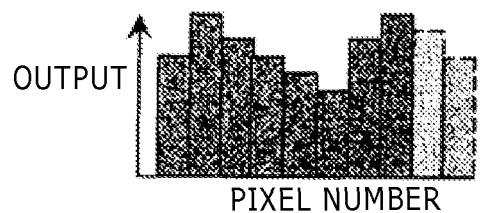
FIGS. 3A through 3D are diagrams showing output signals from pixels of different solid-state image capturing devices.
Figure 3B:
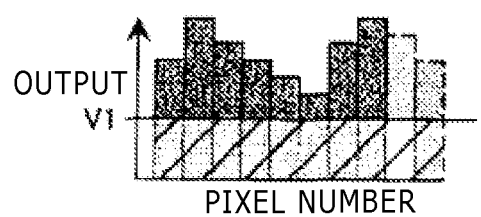

Specifically, FIG. 3A shows output signals generated by pixels, indicated by pixel numbers, of a solid-state image capturing device which is free of a photochromic film, when the pixels are irradiated with light at a higher light intensity level, and FIG. 3B shows output signals generated by pixels, indicated by pixel numbers, of a solid-state image capturing device which includes a photochromic film, when the pixels are irradiated with light at a higher light intensity level.

In FIG. 3B, since the light transmittance of the photochromic film 16 is reduced at the higher light intensity level, the output signals generated by the pixels when they are irradiated with the applied light are lower in level than if the light transmittance of the photochromic film 16 is not reduced, by an amount which is indicated by V1 in FIG. 3B.

Figure 3C:
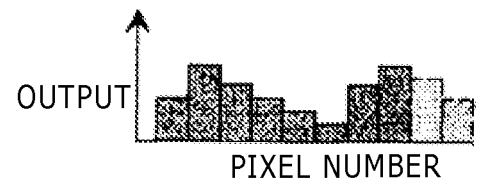
Figure 3D:
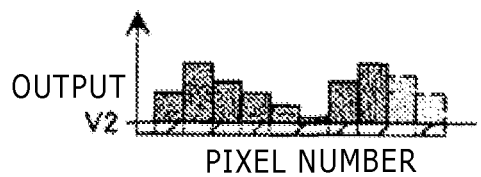

FIG. 3C shows output signals generated by pixels, indicated by pixel numbers, of a solid-state image capturing device which is free of a photochromic film, when the pixels are irradiated with light at a lower light intensity level, and FIG. 3D shows output signals generated by pixels, indicated by pixel numbers, of a solid-state image capturing device which includes a photochromic film, when the pixels are irradiated with light at a lower light intensity level.

In FIG. 3D, since the light transmittance of the photochromic film 16 is slightly reduced at the lower light intensity level, the output signals generated by the pixels when they are irradiated with the applied light are lower in level than if the light transmittance of the photochromic film 16 is not reduced, by a very small amount which is indicated by V2 in FIG. 3D.

As described above, inasmuch as the light transmittance of the photochromic film 16 varies depending on the amount of light applied thereto such that the light transmittance is lower as the intensity of applied light is higher and is little lower as the intensity of applied light is lower. Therefore, the amount of applied light that is required to saturate the output signal generated by the photodiode 11 is higher, expanding the dynamic range of the photodiode 11 at a higher light intensity level.

Figure 4:
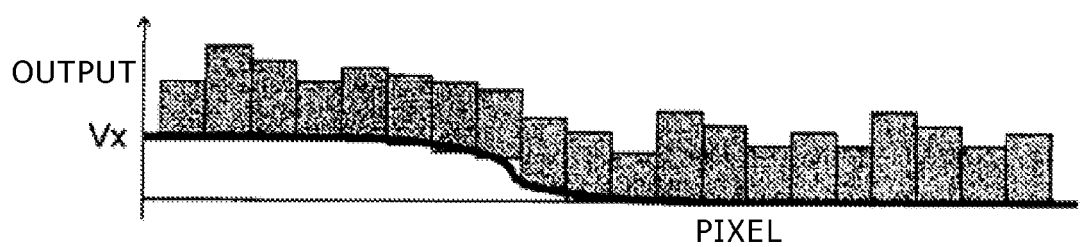
FIG. 4 is a graph showing output signals from pixels of the solid-state image capturing device according to the first embodiment of the present invention.

FIG. 4 is a graph showing output signals from pixels of the solid-state image capturing device according to the first embodiment of the present invention. The graph shown in FIG. 4 shows output signals generated by pixels when they are irradiated with light whose intensity varies continuously from a higher light intensity level to a lower light intensity level.

The light transmittance of the photochromic film 16 in the visible light range varies continuously depending on the amount of applied light.

Alternatively, the light transmittance of the photochromic film 16 in the visible light range may vary discretely, e.g., in multiple steps, depending on the amount of applied light.

As the photochromic film 16 is made of a photochromic film whose light transmittance half-value period is shorter than one frame, the solid-state image capturing device can generate images free from oddities in a wide dynamic range.

At the lower light intensity level, the light transmittance of the photochromic film 16 drops only slightly depending on each frame. Therefore, the S/N ratio of the output signals generated by the pixels at the lower light intensity level is not lowered.

The solid-state image capturing device according to the first embodiment also includes a light amount measuring unit for measuring the amount of light that is absorbed by the photochromic film 16. Specifically, the photochromic film 16 has a photoelectric effect which generates photoelectrons when the photochromic film 16 absorbs light. The amount of light that is absorbed by the photochromic film 16 can thus be measured by detecting a current generated by the photoelectrons or a voltage caused by the current.

Specifically, as shown in FIG. 1, a gate insulating film 30 of silicon oxide and a gate electrode 31 of polysilicon are disposed on the semiconductor substrate 10 in a region outside the pixel, and the semiconductor substrate 10 includes sourcedrains 32, 33 disposed one on each side of the gate electrode 31. Similarly, a gate insulating film 34 of silicon oxide and a gate electrode 35 of polysilicon are disposed on the semiconductor substrate 10 in a region outside the pixel, and the semiconductor substrate 10 includes sourcedrains 36, 37 disposed one on each side of the gate electrode 35.

The gate insulating films 30, 34, the gate electrodes 31, 35, and the sourcedrains 32, 33, 36, 37 make up MOS transistors on the semiconductor substrate 10.

The lower electrode 15 is connected to the sourcedrain 32 and the gate electrode 35, and the upper electrode 17 is connected to ground.

A certain voltage is applied to the sourcedrains 33, 36.

The light amount measuring unit is constructed of the above MOS transistors.

The sourcedrain 32 corresponds to a floating diffusion of a pixel of CMOS image sensor, for example.

The MOS transistor which includes the gate electrode 35 corresponds to an amplifying transistor of a pixel of CMOS image sensor, for example.

Photoelectrons generated by the photochromic film 16 are stored as photoelectric charges in the sourcedrain 32 which serves as a floating diffusion. The sourcedrain 37 outputs a signal S depending on the photoelectric charges stored in the sourcedrain 32.

The signal S that is output from the sourcedrain 37 represents a voltage caused by the photoelectrons that are generated by the photochromic film 16 based on the amount of light that is absorbed thereby. Therefore, the amount of light that is absorbed by the photochromic film 16 can be measured based on the signal S.

The MOS transistor which includes the gate electrode 31 corresponds to a resetting transistor of a pixel of CMOS image sensor, for example.

When the gate electrode 31 is turned on, the photoelectric charges stored in the sourcedrain 32, i.e., the floating diffusion, are reset.

A light signal generated by the light amount measuring unit, i.e., the signal S, which is representative of the amount of applied light that is measured by the light amount measuring unit, and a light signal generated by the photodiode 11 of the pixel may be combined with each other into a pixel signal generated by the pixel. According to this modification, the solid-state image capturing device further includes a signal processor, not shown, for processing the light signal generated by the light amount measuring unit which is representative of the amount of applied light that is measured by the light amount measuring unit and the light signal generated by the photodiode 11 of the pixel. The signal processor performs required calculations on the signals. For example, the signal processor multiplies the signals by respective constants and calculates the sum of the products.

For example, the signal processor adds output signals V1 in FIG. 3B, and adds output signals V2 in FIG. 3D.

In the first embodiment, the photochromic material of the photochromic film 16 has a photoelectric converter function. However, if the photochromic material of the photochromic film 16 does not have a photoelectric converter function, then an output signal from the photochromic film 16 can be synthesized by a signal processing process based on the relationship between the amount of light applied to the photochromic film 16 and the light transmittance thereof. According to this modification, the gate insulating film 30, the gate electrode 31, the sourcedrains 32, 33, the gate insulating film 34, the gate electrode 35, and the sourcedrains 36, 37 shown in FIG. 1 may be dispensed with, and a gamma table may be generated for the signal processing process based on the amount of light that is applied in the minimum period of time during which an electronic shutter combined with the solid-state image capturing device is opened.

If the electric charges in the photochromic film 16 are not saturated within the range of the voltage applied to the solid-state image capturing device shown in FIG. 1, then no circuit is required to reset the electric charges in the gate insulating film 30, the gate electrode 31, and the sourcedrains 32, 33.

[Method of Manufacturing the Solid-state Image Capturing Device]

A method of manufacturing the solid-state image capturing device according to the first embodiment will be described below.

Figure 5A:
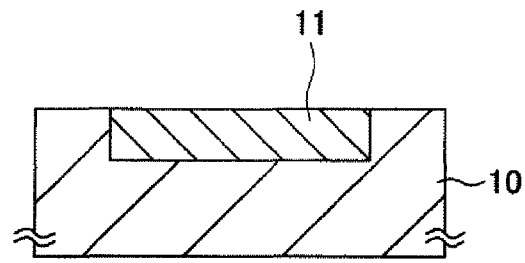
FIGS. 5A through 5C are schematic cross-sectional views showing steps of a method of manufacturing the solid-state image capturing device according to the first embodiment of the present invention.
Figure 5B:
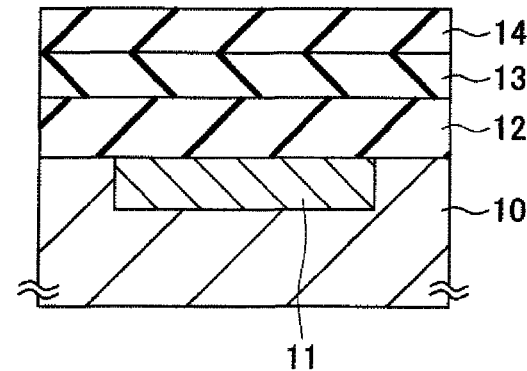
Figure 5C:
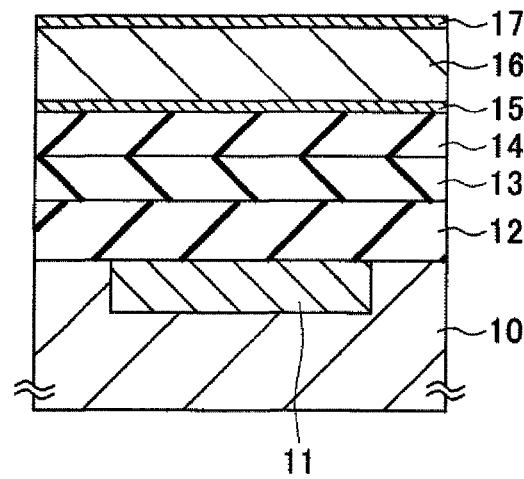

FIGS. 5A through 5C are schematic cross-sectional views showing steps of the method of manufacturing the solid-state image capturing device according to the first embodiment of the present invention.

As shown in FIG. 5A, an electrically conductive impurity is introduced by way of ion implantation into selected regions of the semiconductor substrate 10 to form a plurality of diodes 11 therein that are arranged as a matrix of pixels.

Then, as shown in FIG. 5B the photosensitive surface provided on the semiconductor substrate 10 by each of the photodiode 11 is covered with a first insulating film 12 made of silicon oxide, silicon nitride, or resin, or stacked layers of silicon oxide, silicon nitride, and resin by CVD (Chemical Vapor Deposition), for example.

Then, the first insulating film 12 is covered with a second insulating film 13 made of silicon oxide nitride by CVD, for example.

Then, the second insulating film 13 is covered with a third insulating film 14 made of silicon nitride by CVD, for example.

Then, as shown in FIG. 5C, the third insulating film 14 is covered with a lower electrode 15 of ITO by sputtering, for example.

Then, the lower electrode 15 is covered with a photochromic film 16. The photochromic film 16 may be deposited by any of various processes, e.g., CVD. The photochromic film 16 is made of a photochromic material whose light transmittance half-value period is shorter than one frame of the solid-state image capturing device.

Then, the photochromic film 16 is covered with an upper electrode 17 by sputtering, for example.

Thereafter, an on-chip lens 19 is formed on the upper electrode 17.

According to the first embodiment, as described above, since the photochromic film 16 is made of a photochromic material whose light transmittance half-value period is shorter than one frame of the solid-state image capturing device, the solid-state image capturing device has an expanded dynamic range and can generate images free of oddities.

<Second Embodiment>

[Arrangement of Solid-state Image Capturing Device]

Figure 6:
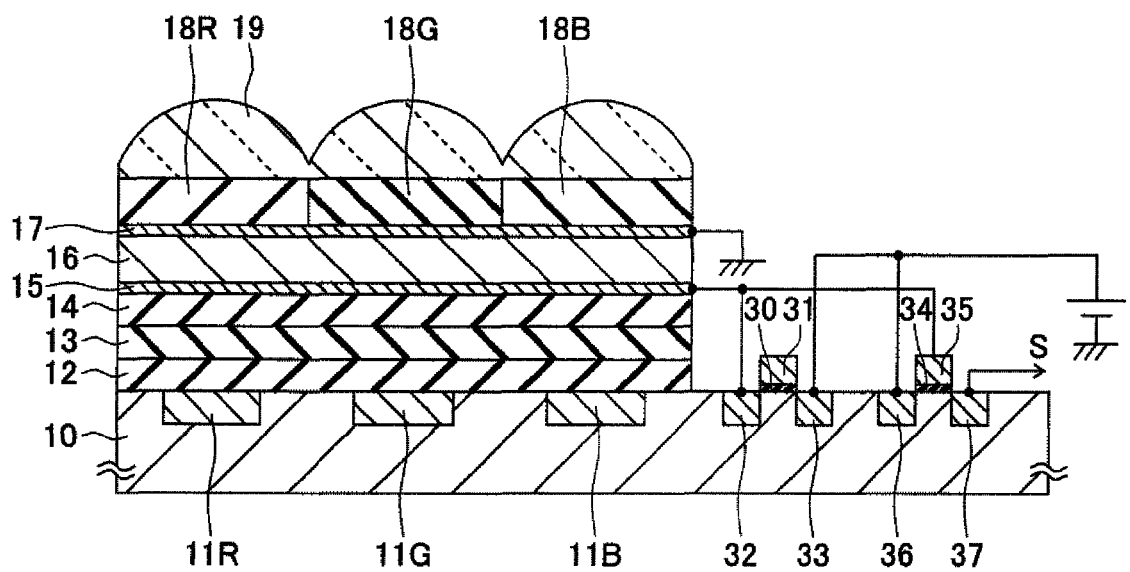
FIG. 6 is a schematic cross-sectional view of a solid-state image capturing device according to a second embodiment of the present invention.

FIG. 6 is a schematic cross-sectional view of a solid-state image capturing device according to a second embodiment of the present invention.

The solid-state image capturing device according to the second embodiment is substantially similar to the solid-state image capturing device according to the first embodiment except that it has a matrix of red, green, and blue pixels.

In each set of red, green, and blue pixels, a photodiode 11R serving as a photoelectric converter of the red pixel, a photodiode 11G serving as a photoelectric converter of the green pixel, and a photodiode 11B serving as a photoelectric converter of the blue pixel are disposed in the semiconductor substrate 11.

The solid-state image capturing device according to the second embodiment also includes a color filter 18R, a color filter 18G, and a color filter 18B disposed on the upper electrode 17 in alignment with the photodiode 11R, the photodiode 11G, and the photodiode 11B, respectively.

Further, the lower electrode 15, the photochromic film 16, and the upper electrode 17 are shared by the red, green, and blue pixels.

With the solid-state image capturing device according to the second embodiment, the light transmittance of the photochromic film 16 varies depending on the amount of light applied thereto such that the light transmittance is lower as the intensity of applied light is higher and is higher as the intensity of applied light is lower. Therefore, a higher amount of applied light is required to saturate the output signal generated by the photodiodes 11R, 11G, 11B, allowing the photodiodes 11R, 11G, 11B to have an expanded dynamic range at a higher light intensity level.

The solid-state image capturing device according to the second embodiment also includes a light amount measuring unit for measuring the amount of light that is absorbed by the photochromic film 16, as with the solid-state image capturing device according to the first embodiment.

Photoelectrons generated by the photochromic film 16 are stored as photoelectric charges in the sourcedrain 32 which serves as a floating diffusion. The sourcedrain 37 outputs a signal S depending on the photoelectric charges stored in the sourcedrain 32.

The signal S that is output from the sourcedrain 37 represents a voltage caused by the photoelectrons that are generated by the photochromic film 16 based on the amount of light that is absorbed thereby. Therefore, the amount of light that is absorbed by the photochromic film 16 can be measured based on the signal S.

The MOS transistor which includes the gate electrode 31 corresponds to a resetting transistor of a pixel of CMOS image sensor, for example.

When the gate electrode 31 is turned on, the photoelectric charges stored in the sourcedrain 32, i.e., the floating diffusion, are reset.

In the second embodiment, the photochromic material of the photochromic film 16 has a photoelectric converter function. However, if the photochromic material of the photochromic film 16 does not have a photoelectric converter function, then an output signal from the photochromic film 16 can be synthesized by a signal processing process based on the relationship between the amount of light applied to the photochromic film 16 and the light transmittance thereof. According to this modification, the gate insulating film 30, the gate electrode 31, the sourcedrains 32, 33, the gate insulating film 34, the gate electrode 35, and the sourcedrains 36, 37 shown in FIG. 6 may be dispensed with, and a gamma table may be generated for the signal processing process based on the amount of light that is applied in the minimum period of time during which an electronic shutter combined with the solid-state image capturing device is opened.

If the electric charges in the photochromic film 16 are not saturated within the range of the voltage applied to the solid-state image capturing device shown in FIG. 6, then no circuit is required to reset the electric charges in the gate insulating film 30, the gate electrode 31, and the sourcedrains 32, 33.

<Third Embodiment>
[Arrangement of Solid-state Image Capturing Device]

Figure 7:
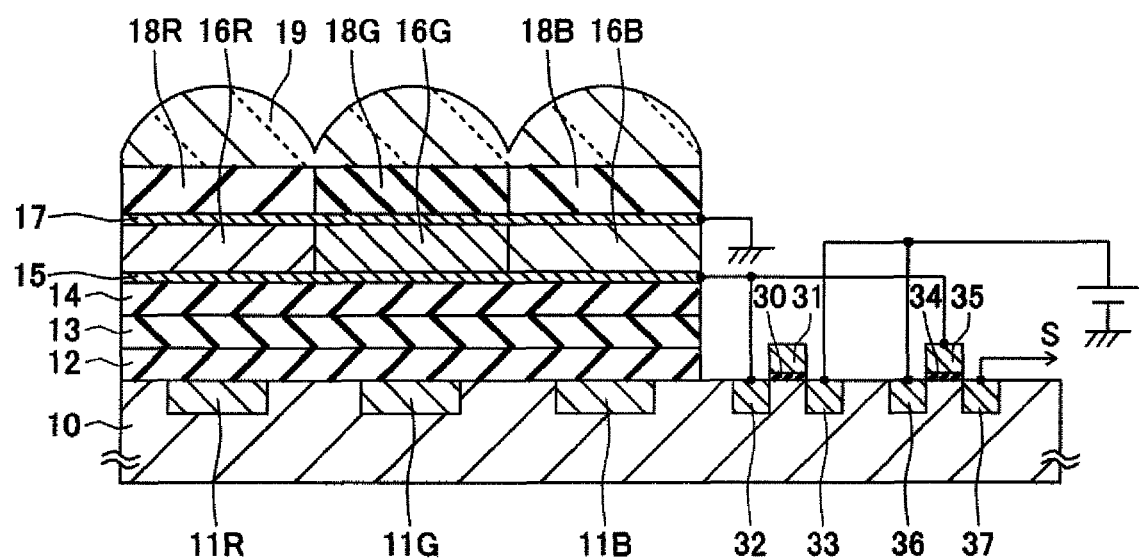
FIG. 7 is a schematic cross-sectional view of a solid-state image capturing device according to a third embodiment of the present invention.

FIG. 7 is a schematic cross-sectional view of a solid-state image capturing device according to a third embodiment of the present invention.

The solid-state image capturing device according to the third embodiment is substantially similar to the solid-state image capturing device according to the second embodiment except that it has different photochromic films made of different materials corresponding respectively to red, green, and blue pixels in each set.

The red pixel is combined with a photochromic film 16R having light absorbing characteristics corresponding to the wavelength range of the red pixel.

The green pixel is combined with a photochromic film 16G having light absorbing characteristics corresponding to the wavelength range of the green pixel.

The blue pixel is combined with a photochromic film 16B having light absorbing characteristics corresponding to the wavelength range of the blue pixel.

The lower electrode 15 and the upper electrode 17 are shared by the red, green, and blue pixels. However, the lower electrode 15 and the upper electrode 17 may be divided into different electrode regions corresponding respectively to the red, green, and blue pixels.

With the solid-state image capturing device according to the third embodiment, the light transmittance of the photochromic films 16R, 16G, 16B varies depending on the amount of light applied thereto such that the light transmittance is lower as the intensity of applied light is higher and is higher as the intensity of applied light is lower. Therefore, a higher amount of applied light is required to saturate the output signal generated by the photodiodes 11R, 11G, 11B, allowing the photodiodes 11R, 11G, 11B to have an expanded dynamic range at a higher light intensity level.

The solid-state image capturing device according to the third embodiment also includes a light amount measuring unit for measuring the amount of light that is absorbed by the photochromic films 16R, 16G, 16B, as with the solid-state image capturing device according to the first embodiment.

Photoelectrons generated by the photochromic films 16R, 16G, 16B are stored as photoelectric charges in the sourcedrain 32 which serves as a floating diffusion. The sourcedrain 37 outputs a signal S depending on the photoelectric charges stored in the sourcedrain 32.

The signal S that is output from the sourcedrain 37 represents a voltage caused by the photoelectrons that are generated by the photochromic films 16R, 16G, 16B based on the amount of light that is absorbed thereby. Therefore, the amount of light that is absorbed by the photochromic films 16R, 16G, 16B can be measured based on the signal S.

The MOS transistor which includes the gate electrode 31 corresponds to a resetting transistor of a pixel of CMOS image sensor, for example.

When the gate electrode 31 is turned on, the photoelectric charges stored in the sourcedrain 32, i.e., the floating diffusion, are reset.

Each of the photochromic materials of the photochromic films 16R, 16G, 16B may be hexarylbisimidazole derivative, for example. By changing the substituent group of the hexarylbisimidazole derivative, each of the photochromic films 16R, 16G, 16B may have an appropriate wavelength absorption range and response speed.

The photochromic material of the photochromic film 16B should preferably include the following compound, for example.

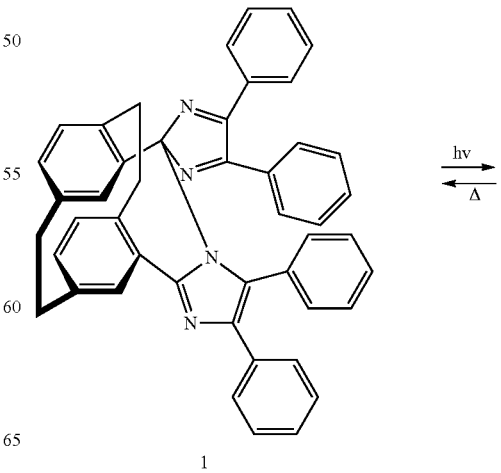

1

-continued

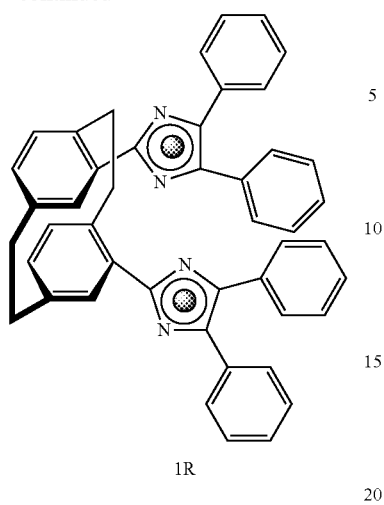

1R

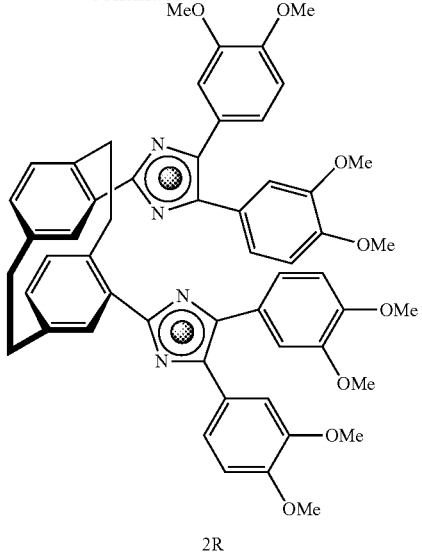

2R

Figure 8A:
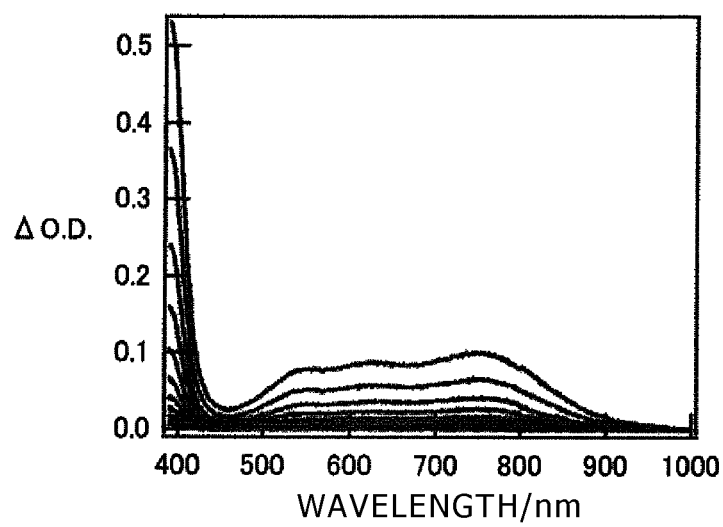
FIGS. 8A and 8B are graphs showing the light transmittance characteristics of a photochromic material of a photochromic film of the solid-state image capturing device according to the third embodiment of the present invention.

FIG. 8A shows time-dependent changes in ΔO.D. (optical density change) of the hexarylbisimidazole derivative at the time light is applied thereto and ΔO.D. (optical density change) of the hexarylbisimidazole derivative at the time the applied light is blocked, the time-depending changes corresponding to time-dependent changes in light absorption spectrums. The light absorption spectrums are spaced at intervals of 20 ms.

Figure 8B:
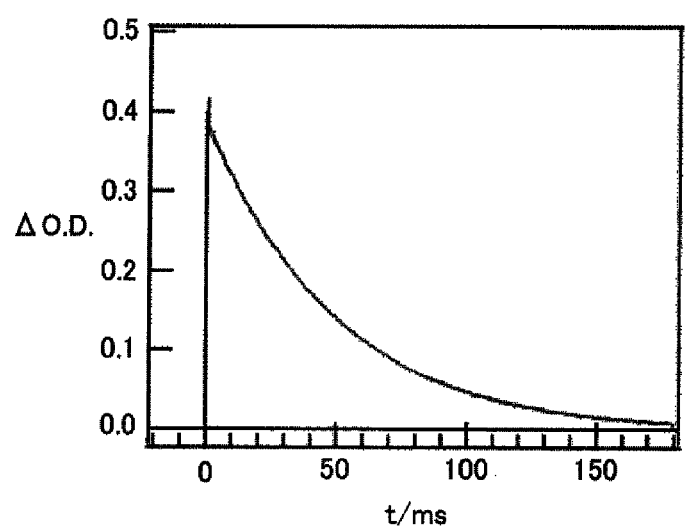

FIG. 8B shows time-dependent changes in ΔO.D. with a wavelength of 400 nm at 25° C. Since the half-value period is of about 33 ms, and the light transmittance varies quickly depending on the applied light, it is possible to expand the dynamic range without causing image oddities.

The photochromic material of the photochromic film 16G should preferably include the following compound, for example.

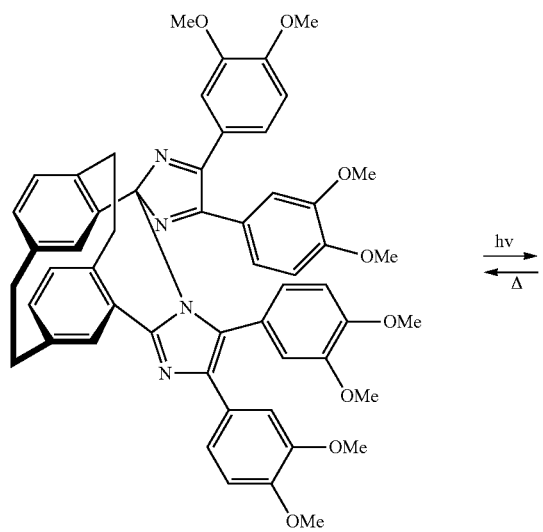

2

Figure 9A:
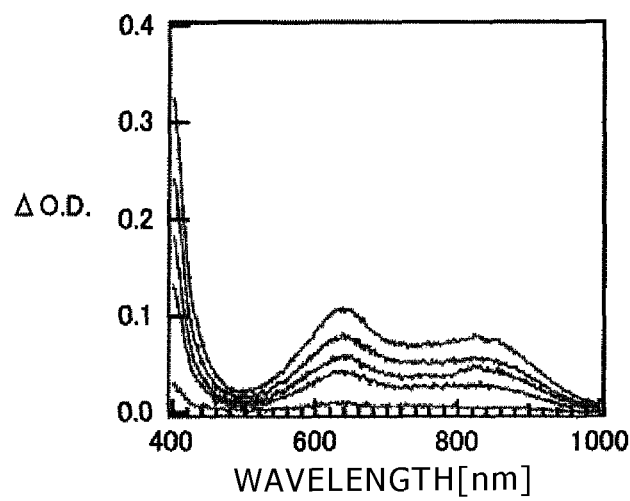
FIGS. 9A and 9B are graphs showing the light transmittance characteristics of a photochromic material of a photochromic film of the solid-state image capturing device according to the third embodiment of the present invention.

FIG. 9A shows time-dependent changes in ΔO.D. (optical density change) of the hexarylbisimidazole derivative at the time light is applied thereto and ΔO.D. (optical density change) of the hexarylbisimidazole derivative at the time the applied light is blocked, the time-depending changes corresponding to time-dependent changes in light absorption spectrums. The light absorption spectrums are spaced at intervals of 20 ms.

Figure 9B:
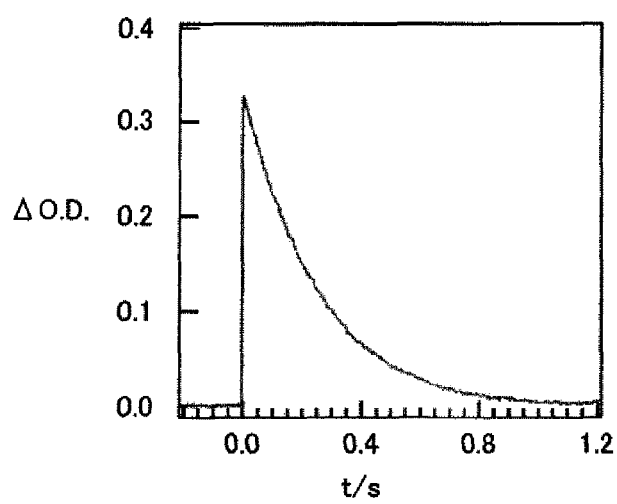

FIG. 9B shows time-dependent changes in ΔO.D. with a wavelength of 400 nm at 25° C. Since the half-value period is of about 173 ms and the light transmittance varies quickly depending on the applied light, it is possible to expand the dynamic range without causing image oddities.

The hexarylbisimidazole derivatives for use as the photochromic materials of the photochromic films 16G, 16B are commercially available as rapid color-switching photochromic compounds from Kanto Chemical Co., Ltd.

The photochromic material of the photochromic film 16R may be obtained by changing the substituent group of any of the above hexarylbisimidazole derivatives for an appropriate wavelength absorption range and response speed.

[Method of Manufacturing the Solid-state Image Capturing Device]

A method of manufacturing the solid-state image capturing device according to the third embodiment will be described below.

FIGS. 10A through 11B are schematic cross-sectional views showing steps of the method of manufacturing the solid-state image capturing device according to the third embodiment of the present invention.

Figure 10A:
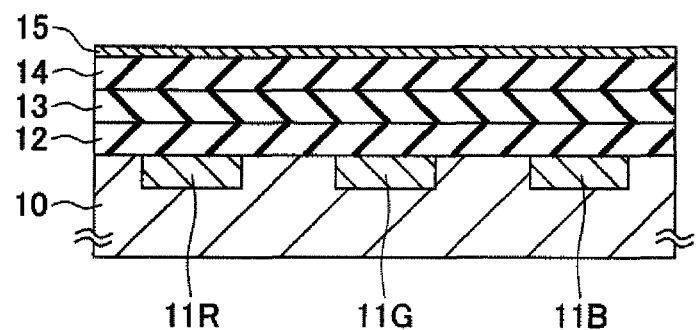
FIGS. 10A and 10B are schematic cross-sectional views showing steps of a method of manufacturing the solid-state image capturing device according to the third embodiment of the present invention.

As shown in FIG. 10A, an electrically conductive impurity is introduced by way of ion implantation into selected regions of the semiconductor substrate 10 to form photodiodes 11R, 11G, 11B therein that are arranged as a matrix of red, green, and blue pixels.

Then, the photosensitive surface provided on the semiconductor substrate 10 by each of the photodiodes 11R, 11G, 11B is covered with a first insulating film 12, a second insulating film 13, and a third insulating film 14 by CVD, for example.

Then, the third insulating film 14 is covered with a lower electrode 15 of ITO by sputtering, for example.

Figure 10B:
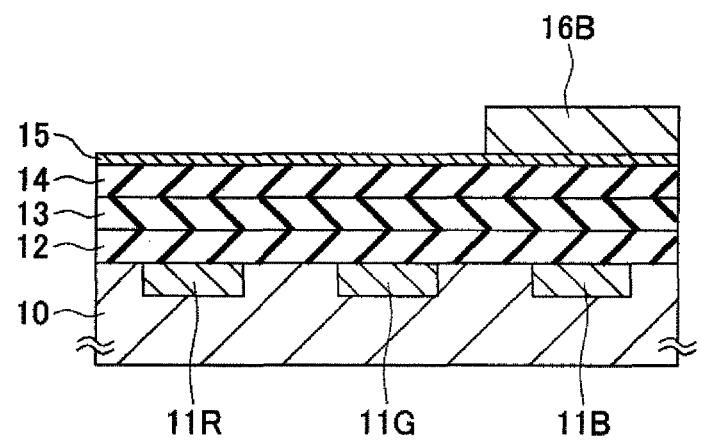

Then, as shown in FIG. 10B, a photochromic film 16B is formed on the entire surface by CVD, for example. Then, a patterned resist film is deposited on the photochromic film 16B to protect a region where the blue pixel is to be formed, and then the entire surface is etched by an RIE (reactive ion etching) process to remove the photochromic film 16B except the region where the blue pixel is to be formed.

Figure 11A:
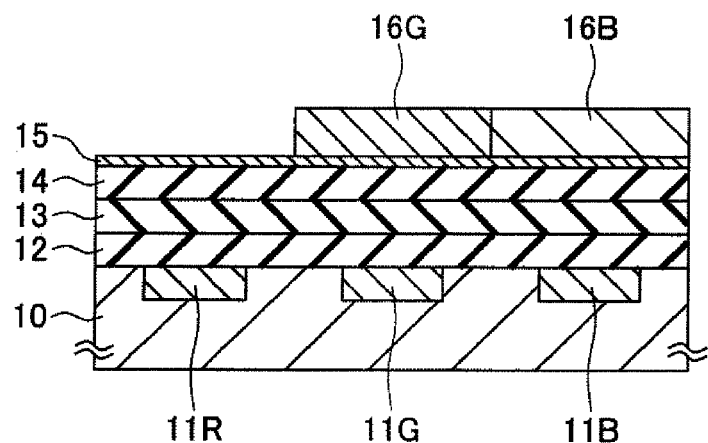
FIGS. 11A and 11B are schematic cross-sectional views showing steps of the method of manufacturing the solid-state image capturing device according to the third embodiment of the present invention.

Then, as shown in FIG. 11A, a photochromic film 16G is formed on the entire surface by CVD, for example. Then, a patterned resist film is deposited on the photochromic film 16G to protect a region where the green pixel is to be formed, and then the entire surface is etched by an RIE process to remove the photochromic film 16G except the region where the green pixel is to be formed.

Figure 11B:
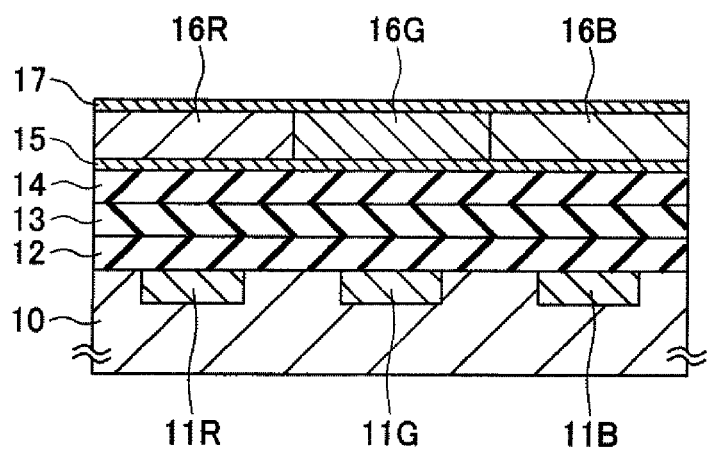

Then, as shown in FIG. 11B, a photochromic film 16B is formed on the entire surface by CVD, for example. Then, a patterned resist film is deposited on the photochromic film 16B to protect a region where the red pixel is to be formed, and then the entire surface is etched by an RIE process to remove the photochromic film 16B except the region where the red pixel is to be formed.

Each of the photochromic films 16R, 16G, 16B may be formed by changing the substituent group of the hexarylbisimidazole derivative for a desired appropriate wavelength absorption ranges and response speed.

Then, the photochromic films 16R, 16G, 16B are covered with an upper electrode 17 of ITO by sputtering, for example.

Thereafter, the color filter 18R, the color filter 18G, and the color filter 18B are formed on the upper electrode 17, and on-chip lenses 19 are disposed on the color filter 18R, the color filter 18G, and the color filter 18B, respectively.

In the third embodiment, the photochromic films 16R, 16G, 16B are successively grown and patterned in the order named. However, the photochromic films 16R, 16G, 16B may be successively grown and patterned in any desired order.

According to the third embodiment, as described above, since the photochromic films 16R, 16G, 16B are made of photochromic materials whose light transmittance half-value period is shorter than one frame of the solid-state image capturing device, the solid-state image capturing device has an expanded dynamic range without causing oddities in images captured thereby.

In the third embodiment, the photochromic materials of the photochromic films 16R, 16G, 16B have a photoelectric converter function. However, if the photochromic materials of the photochromic films 16R, 16G, 16B do not have a photoelectric converter function, then output signals from the photochromic films 16R, 16G, 16B can be synthesized by a signal processing process based on the relationship between the amount of light applied to the photochromic films 16R, 16G, 16B and the light transmittance thereof. According to this modification, the gate insulating film 30, the gate electrode 31, the sourcedrains 32, 33, the gate insulating film 34, the gate electrode 35, and the sourcedrains 36, 37 shown in FIG. 7 may be dispensed with, and a gamma table may be generated for the signal processing process based on the amount of light that is applied in the minimum period of time during which an electronic shutter combined with the solid-state image capturing device is opened.

If the electric charges in the photochromic films 16R, 16G, 16B are not saturated within the range of the voltage applied to the solid-state image capturing device shown in FIG. 7, then no circuit is required to reset the electric charges in the gate insulating film 30, the gate electrode 31, and the sourcedrains 32, 33.

<Fourth Embodiment>
[Arrangement of Solid-state Image Capturing Device]

Figure 12:
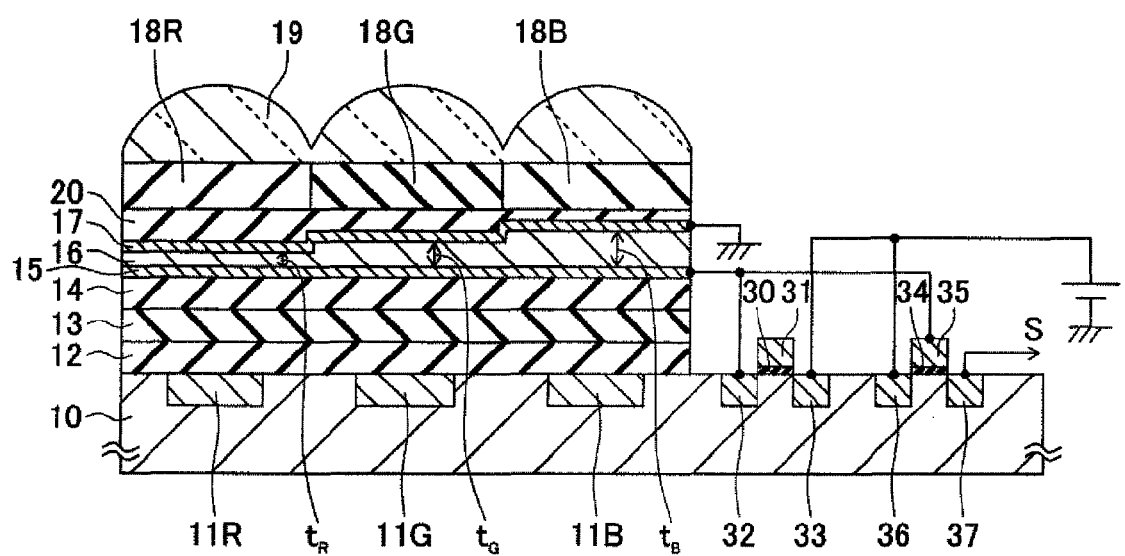
FIG. 12 is a schematic cross-sectional view of a solid-state image capturing device according to a fourth embodiment of the present invention.

FIG. 12 is a schematic cross-sectional view of a solid-state image capturing device according to a fourth embodiment of the present invention.

The solid-state image capturing device according to the fourth embodiment is substantially similar to the solid-state image capturing device according to the second embodiment except that it has a photochromic film 16 made of one material and having different film thicknesses corresponding respectively to red, green, and blue pixels in each set.

The photochromic film 16 has a film thickness $t_R$ combined with the red pixel and selected to provide light absorbing characteristics corresponding to the wavelength range of the red pixel.

The photochromic film 16 also has a film thickness $t_G$ combined with the green pixel and selected to provide light absorbing characteristics corresponding to the wavelength range of the green pixel.

The photochromic film 16 also has a film thickness $t_B$ combined with the blue pixel and selected to provide light absorbing characteristics corresponding to the wavelength range of the blue pixel.

The upper electrode 17 on the photochromic film 16 is covered with a planarizing film 20 which planarizes the steps of the upper electrode 17 that are formed by the different film thicknesses of the photochromic film 16.

The lower electrode 15 and the upper electrode 17 are shared by the red, green, and blue pixels. However, the lower electrode 15 and the upper electrode 17 may be divided into different electrode regions corresponding respectively to the red, green, and blue pixels.

With the solid-state image capturing device according to the fourth embodiment, the light transmittance of the photochromic film 16 varies depending on the amount of light applied thereto such that the light transmittance is lower as the intensity of applied light is higher and is higher as the intensity of applied light is lower. Therefore, a higher amount of applied light is required to saturate the output signal generated by the photodiodes 11R, 11G, 11B, allowing the photodiodes 11R, 11G, 11B to have an expanded dynamic range at a higher light intensity level.

The solid-state image capturing device according to the fourth embodiment also includes a light amount measuring unit for measuring the amount of light that is absorbed by the photochromic film 16, as with the solid-state image capturing device according to the first embodiment.

Photoelectrons generated by the photochromic film 16 are stored as photoelectric charges in the sourcedrain 32 which serves as a floating diffusion. The sourcedrain 37 outputs a signal S depending on the photoelectric charges stored therein.

The signal S that is output from the sourcedrain 37 represents a voltage caused by the photoelectrons that are generated by the photochromic film 16 based on the amount of light that is absorbed thereby. Therefore, the amount of light that is absorbed by the photochromic film 16 can be measured based on the signal S.

The MOS transistor which includes the gate electrode 31 corresponds to a resetting transistor of a pixel of CMOS image sensor, for example.

When the gate electrode 31 is turned on, the photoelectric charges stored in the sourcedrain 32, i.e., the floating diffusion, are reset.

The photochromic material of the photochromic film 16 may be hexarylbisimidazole derivative, for example, as with the third embodiment.

By changing the substituent group of the hexarylbisimidazole derivative, the photochromic film 16 may have an appropriate wavelength absorption range and response speed.

[Method of Manufacturing the Solid-state Image Capturing Device]

A method of manufacturing the solid-state image capturing device according to the fourth embodiment will be described below.

FIGS. 13A through 14B are schematic cross-sectional views showing steps of the method of manufacturing the solid-state image capturing device according to the fourth embodiment of the present invention.

Figure 13A:
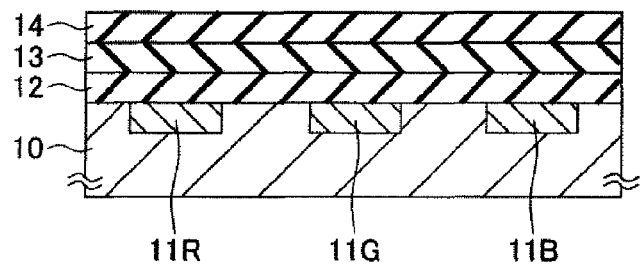
FIGS. 13A through 13C are schematic cross-sectional views showing steps of a method of manufacturing the solid-state image capturing device according to the fourth embodiment of the present invention.

As shown in FIG. 13A, an electrically conductive impurity is introduced by way of ion implantation into selected regions of the semiconductor substrate 10 to form diodes 11R, 11G, 11B therein that are arranged as a matrix of red, green, and blue pixels.

Then, the photosensitive surface provided on the semiconductor substrate 10 by each of the photodiodes 11R, 11G, 11B is covered with a first insulating film 12, a second insulating film 13, and a third insulating film 14 by CVD, for example.

Figure 13B:
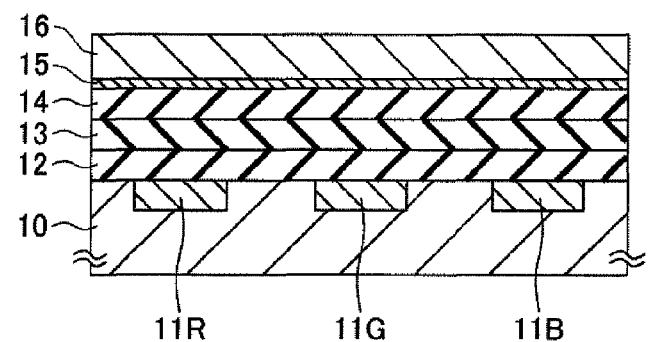

Then, as shown in FIG. 13B, the third insulating film 14 is covered with a lower electrode 15 of ITO by sputtering, for example.

Then, a photochromic film 16 is formed on the entire surface by CVD, for example.

Figure 13C:
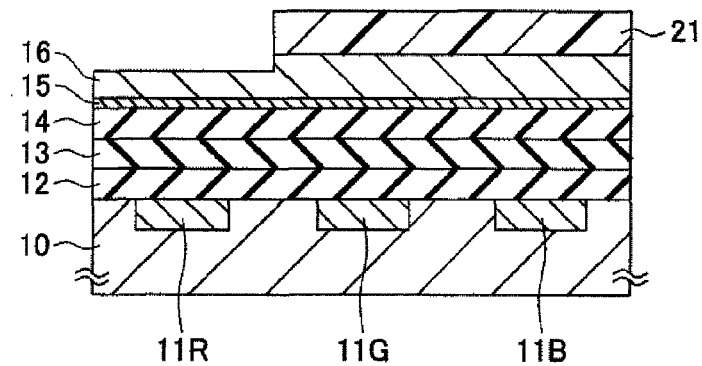

Then, as shown in FIG. 13C, a patterned resist film 21 for providing an opening in which to form a region where the red pixel is to be formed is deposited, and then the entire surface is etched by an RIE process to reduce the film thickness of the photochromic film 16 in the region where the red pixel is to be formed.

Figure 14A:
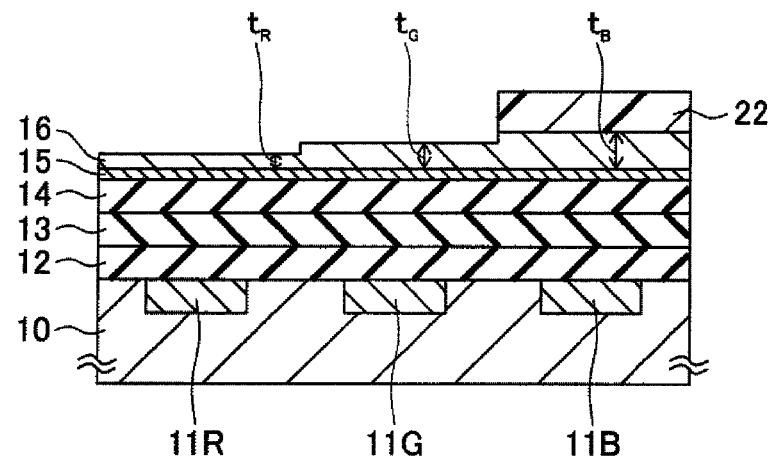
FIGS. 14A and 14B are schematic cross-sectional views showing steps of the method of manufacturing the solid-state image capturing device according to the fourth embodiment of the present invention.

Then, as shown in FIG. 14A, a patterned resist film 22 for providing openings in which to form regions where the red and green pixels are to be formed is deposited, and then the entire surface is etched by an RIE process to reduce the film thickness of the photochromic film 16 in the regions where the red and green pixels is to be formed.

According to the above etching processes, the photochromic film 16 has a film thickness $t_R$ in the red pixel, a film thickness $t_G$ in the green pixel, and a film thickness $t_B$ in the blue pixel. The film thickness $t_R$ in the red pixel is achieved by the two etching processes.

Figure 14B:
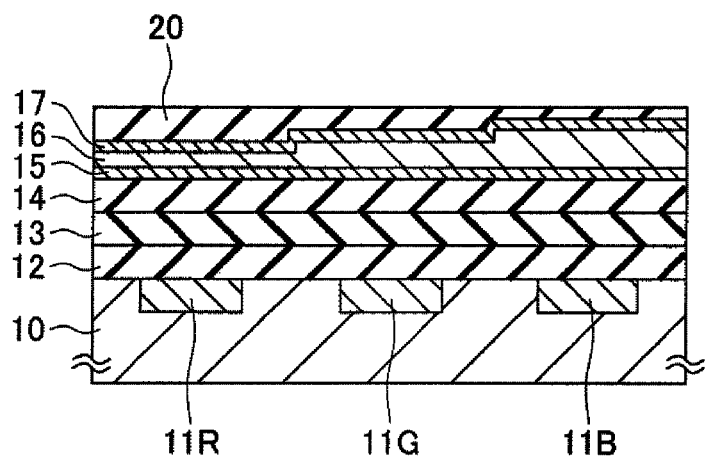

Then, as shown in FIG. 14B, the photochromic film 16 is covered with an upper electrode 17 of ITO by sputtering, for example.

Thereafter, the upper electrode 17 is coated with a resin to form a planarizing film 20.

On-chip lenses 19 are then formed on the planarizing film 20.

In the fourth embodiment, the above fabrication process is employed because the film thickness $t_R$ of the photochromic film 16 is the smallest and the film thickness $t_B$ of the photochromic film 16 is the greatest. However, the fabrication process may be modified depending on the order in which the different film thicknesses are to be produced. The smallest film thickness may be achieved by the two etching processes.

As the photochromic film 16 is made of a photochromic film whose light transmittance half-value period is shorter than one frame, the solid-state image capturing device can generate images free from oddities in a wide dynamic range.

In the fourth embodiment, the photochromic material of the photochromic film 16 has a photoelectric converter function. However, if the photochromic material of the photochromic film 16 does not have a photoelectric converter function, then an output signal from the photochromic film 16 can be synthesized by a signal processing process based on the relationship between the amount of light applied to the photochromic film 16 and the light transmittance thereof. According to this modification, the gate insulating film 30, the gate electrode 31, the sourcedrains 32, 33, the gate insulating film 34, the gate electrode 35, and the sourcedrains 36, 37 shown in FIG. 12 may be dispensed with, and a gamma table may be generated for the signal processing process based on the amount of light that is applied in the minimum period of time during which an electronic shutter combined with the solid-state image capturing device is opened.

If the electric charges in the photochromic film 16 are not saturated within the range of the voltage applied to the solid-state image capturing device shown in FIG. 12, then no circuit is required to reset the electric charges in the gate insulating film 30, the gate electrode 31, and the sourcedrains 32, 33.

<Fifth Embodiment>

[Arrangement of Solid-state Image Capturing Device]

Figure 15:
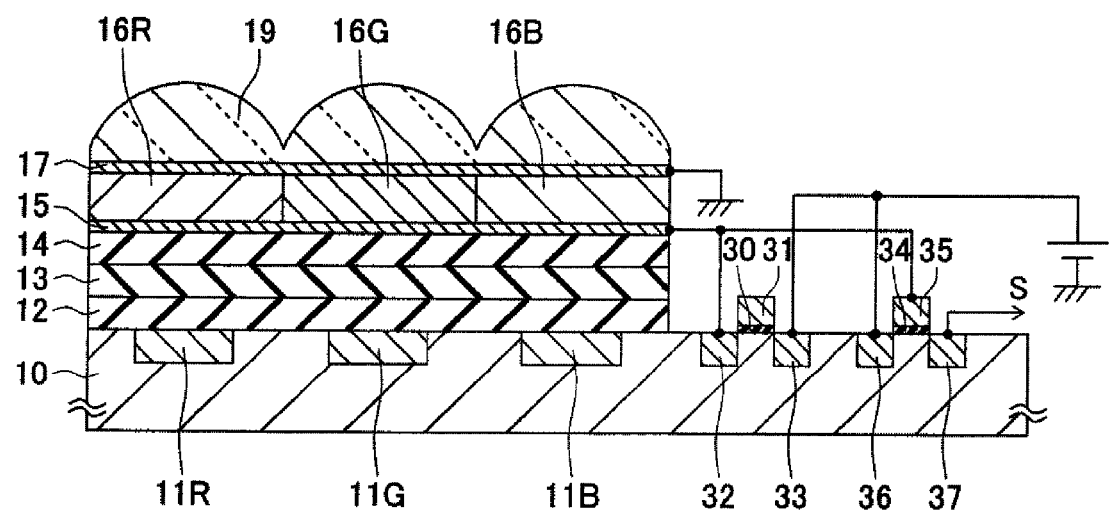
FIG. 15 is a schematic cross-sectional view of a solid-state image capturing device according to a fifth embodiment of the present invention.

FIG. 15 is a schematic cross-sectional view of a solid-state image capturing device according to a fifth embodiment of the present invention.

The solid-state image capturing device according to the fifth embodiment is substantially similar to the solid-state image capturing device according to the second embodiment except that it has photochromic films doubling as color filters.

The red pixel is combined with a photochromic film 16R having light absorbing characteristics corresponding to the wavelength range of the red pixel, and doubling as a red color filter.

The green pixel is combined with a photochromic film 16G having light absorbing characteristics corresponding to the wavelength range of the green pixel, and doubling as a green color filter.

The blue pixel is combined with a photochromic film 16B having light absorbing characteristics corresponding to the wavelength range of the blue pixel, and doubling as a blue color filter.

The lower electrode 15 and the upper electrode 17 are shared by the red, green, and blue pixels. However, the lower electrode 15 and the upper electrode 17 may be divided into different electrode regions corresponding respectively to the red, green, and blue pixels.

With the solid-state image capturing device according to the fifth embodiment, the light transmittance of the photochromic films 16R, 16G, 16B varies depending on the amount of light applied thereto such that the light transmittance is lower as the intensity of applied light is higher and is higher as the intensity of applied light is lower. Therefore, a higher amount of applied light is required to saturate the output signal generated by the photodiodes 11R, 11G, 11B, allowing the photodiodes 11R, 11G, 11B to have an expanded dynamic range at a higher light intensity level.

The solid-state image capturing device according to the fifth embodiment also includes a light amount measuring unit for measuring the amount of light that is absorbed by the photochromic films 16R, 16G, 16B, as with the solid-state image capturing device according to the first embodiment.

Photoelectrons generated by the photochromic films 16R, 16G, 16B are stored as photoelectric charges in the sourcedrain 32 which serves as a floating diffusion. The sourcedrain 37 outputs a signal S depending on the photoelectric charges stored therein.

The signal S that is output from the sourcedrain 37 represents a voltage caused by the photoelectrons that are generated by the photochromic films 16R, 16G, 16B based on the amount of light that is absorbed thereby. Therefore, the amount of light that is absorbed by the photochromic films 16R, 16G, 16B can be measured based on the signal S.

The MOS transistor which includes the gate electrode 31 corresponds to a resetting transistor of a pixel of CMOS image sensor, for example.

When the gate electrode 31 is turned on, the photoelectric charges stored in the sourcedrain 32, i.e., the floating diffusion, are reset.

Each of the photochromic materials of the photochromic films 16R, 16G, 16B may be hexarylbisimidazole derivative, for example.

Since the hexarylbisimidazole derivative has a photochromic property only, a component that functions as a color filter is added to the hexarylbisimidazole derivative.

In the fifth embodiment, the photochromic materials of the photochromic films 16R, 16G, 16B have a photoelectric converter function. However, if the photochromic materials of the photochromic films 16R, 16G, 16B do not have a photoelectric converter function, then output signals from the photochromic films 16R, 16G, 16B can be synthesized by a signal processing process based on the relationship between the amount of light applied to the photochromic films 16R, 16G, 16B and the light transmittance thereof. According to this modification, the gate insulating film 30, the gate electrode 31, the sourcedrains 32, 33, the gate insulating film 34, the gate electrode 35, and the sourcedrains 36, 37 shown in FIG. 15 may be dispensed with, and a gamma table may be generated for the signal processing process based on the amount of light that is applied in the minimum period of time during which an electronic shutter combined with the solid-state image capturing device is opened.

If the electric charges in the photochromic film 16 are not saturated within the range of the voltage applied to the solid-state image capturing device shown in FIG. 15, then no circuit is required to reset the electric charges in the gate insulating film 30, the gate electrode 31, and the sourcedrains 32, 33.

<Sixth Embodiment>
[Arrangement of Solid-state Image Capturing Device]

A sixth embodiment of the present invention represents a modification of the divided pattern of the upper and lower electrodes, and is applicable to any of the first through fifth embodiments.

Figure 16A:
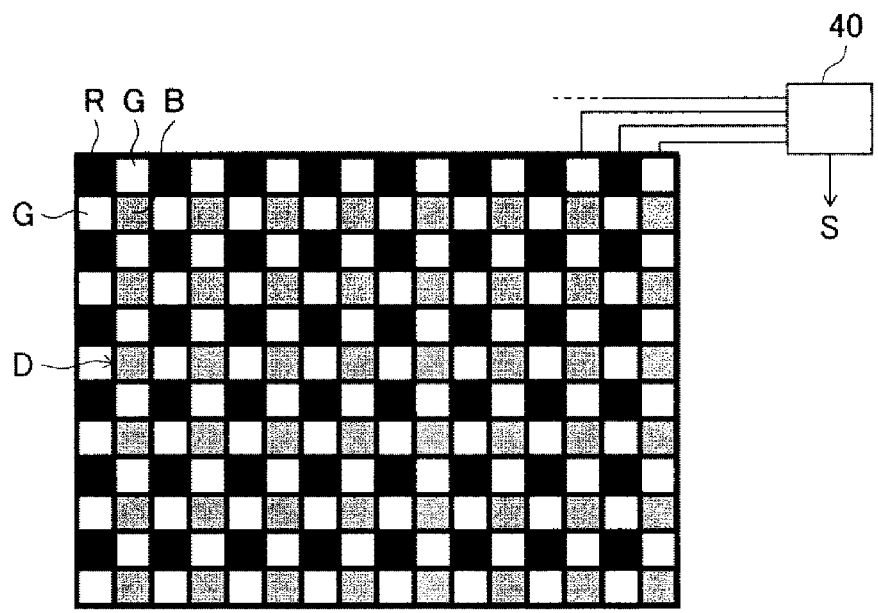
FIG. 16A is a schematic plan view showing a layout and arrangement of a solid-state image capturing device according to a sixth embodiment of the present invention.
Figure 16B:
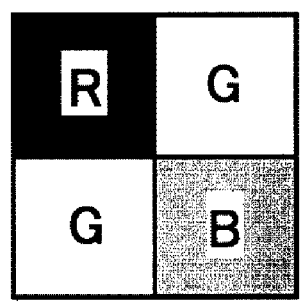
FIG. 16B is an enlarged partial plan view of the solid-state image capturing device according to the sixth embodiment of the present invention.

FIG. 16A is a schematic plan view showing a layout and arrangement of a solid-state image capturing device according to a sixth embodiment of the present invention, and FIG. 16B is an enlarged partial plan view of the solid-state image capturing device according to the sixth embodiment of the present invention.

In FIGS. 16A and 16B, thick solid lines D indicate the boundaries between divided regions of the upper electrode or the lower electrode.

According to the layout and arrangement shown in FIGS. 16A and 16B, all the pixels including red pixels R, green pixels G, and blue pixels B are divided from each other.

The photochromic films of the pixels are connected to a signal processor 40 by respective interconnects. The signal processor 40 generates and outputs pixel signals S based on output signals from the photodiodes as photoelectric converters of the pixels and output signals from the photochromic films of the pixels.

The signal processor 40 may have a circuit arrangement as disclosed in Japanese Patent Laid-open No. Sho 59-1088466, for example.

Figure 17A:
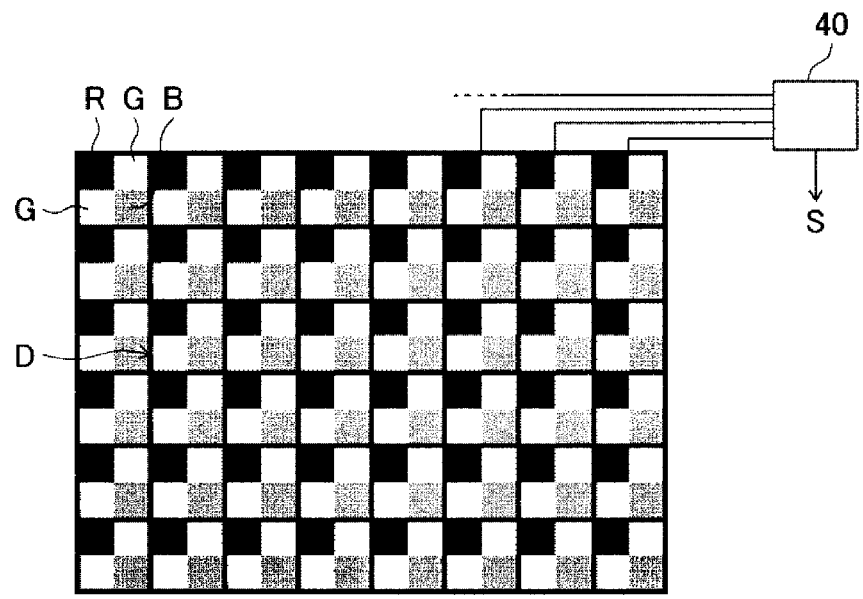
FIG. 17A is a schematic plan view showing a layout and arrangement of a solid-state image capturing device according to the sixth embodiment of the present invention.
Figure 17B:
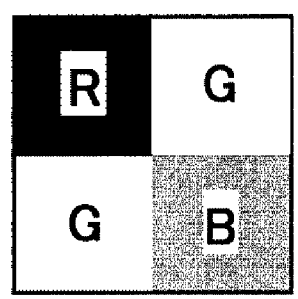
FIG. 17B is an enlarged partial plan view of the solid-state image capturing device according to the sixth embodiment of the present invention.

FIG. 17A is a schematic plan view showing a layout and arrangement of a solid-state image capturing device according to the sixth embodiment of the present invention, and FIG. 17B is an enlarged partial plan view of the solid-state image capturing device according to the sixth embodiment of the present invention.

In FIGS. 17A and 17B, the thick solid lines D indicate the boundaries between divided regions of the upper electrode or the lower electrode.

According to the layout and arrangement shown in FIGS. 17A and 17B, the upper electrode or the lower electrode is divided into regions each including a set of four pixels, known as a Bayer array, which include one red pixel R, two green pixels G, and one blue pixel B.

The photochromic films of the pixels are connected to the signal processor 40 by respective interconnects. The signal processor 40 generates and outputs pixel signals S based on output signals from the photodiodes as photoelectric converters of the pixels and output signals from the photochromic films of the sets of pixels.

Figure 18:
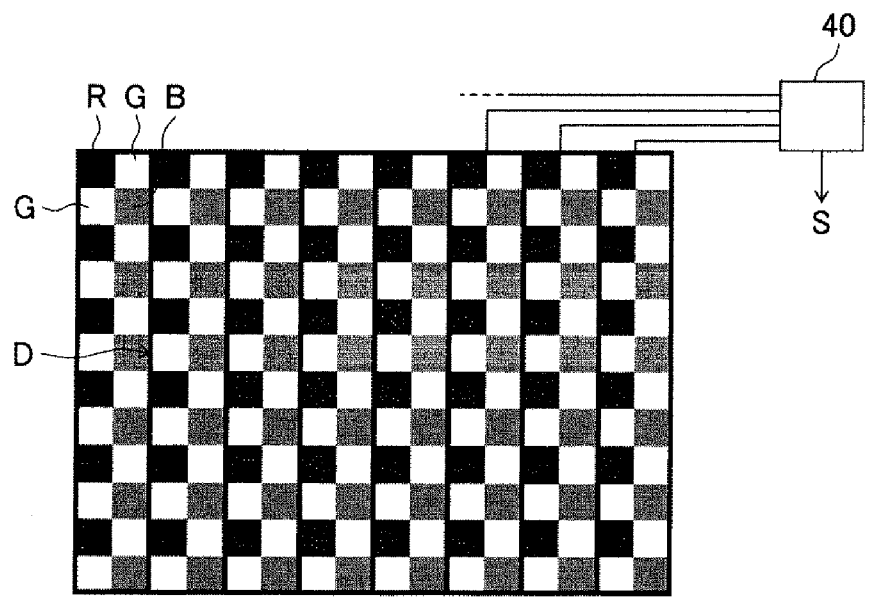
FIG. 18 is a schematic plan view showing a layout and arrangement of a solid-state image capturing device according to the sixth embodiment of the present invention.

FIG. 18 is a schematic plan view showing a layout and arrangement of a solid-state image capturing device according to the sixth embodiment of the present invention.

In FIG. 18, the thick solid lines D indicate the boundaries between divided regions of the upper electrode or the lower electrode.

According to the layout and arrangement shown in FIG. 18, the upper electrode or the lower electrode is divided into regions each including a set of pixels which include two columns of pixels.

The photochromic films of the sets of pixels are connected to the signal processor 40 by respective interconnects. The signal processor 40 generates and outputs pixel signals S based on output signals from the photodiodes as photoelectric converters of the pixels and output signals from the photochromic films of the sets of pixels.

Figure 19:
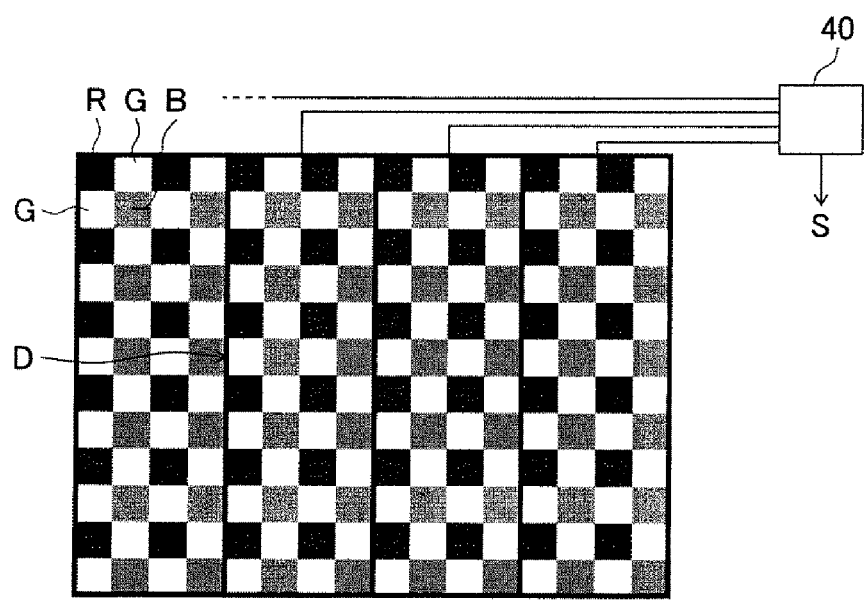
FIG. 19 is a schematic plan view showing a layout and arrangement of a solid-state image capturing device according to the sixth embodiment of the present invention.

FIG. 19 is a schematic plan view showing a layout and arrangement of a solid-state image capturing device according to the sixth embodiment of the present invention.

In FIG. 19, the thick solid lines D indicate the boundaries between divided regions of the upper electrode or the lower electrode.

According to the layout and arrangement shown in FIG. 19, the upper electrode or the lower electrode is divided into regions each including a set of pixels which include four columns of pixels.

The photochromic films of the sets of pixels are connected to the signal processor 40 by respective interconnects. The signal processor 40 generates and outputs pixel signals S based on output signals from the photodiodes as photoelectric converters of the pixels and output signals from the photochromic films of the sets of pixels.

Figure 20:
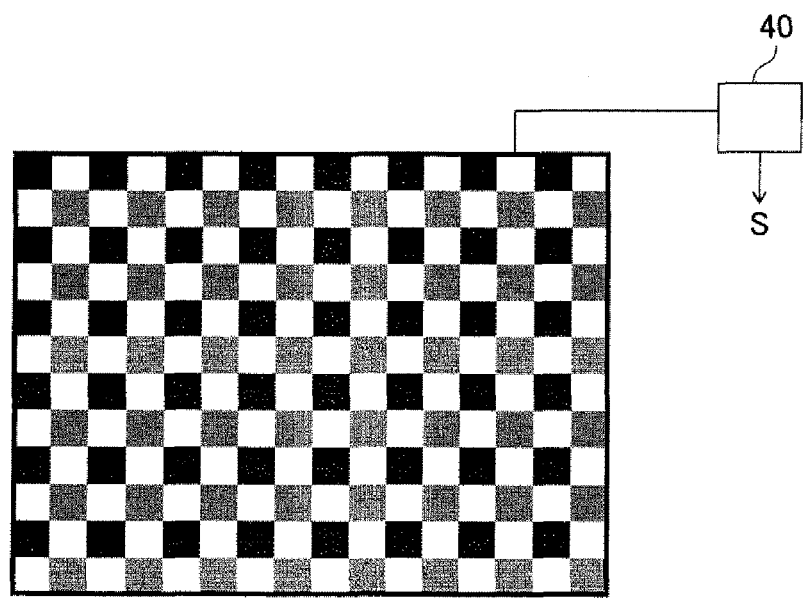
FIG. 20 is a schematic plan view showing a layout and arrangement of a solid-state image capturing device according to the sixth embodiment of the present invention.

FIG. 20 is a schematic plan view showing a layout and arrangement of a solid-state image capturing device according to the sixth embodiment of the present invention.

According to the layout and arrangement shown in FIG. 19, the upper electrode or the lower electrode is not divided into regions, but is shared by all the pixels.

The photochromic film shared by the pixels is connected to the signal processor 40 by respective interconnects. The signal processor 40 generates and outputs pixel signals S based on output signals from the photodiodes as photoelectric converters of the pixels and an output signal from the photochromic film shared by the pixels.

<Seventh Embodiment>
[Arrangement of Solid-state Image Capturing Device]

Figure 21:
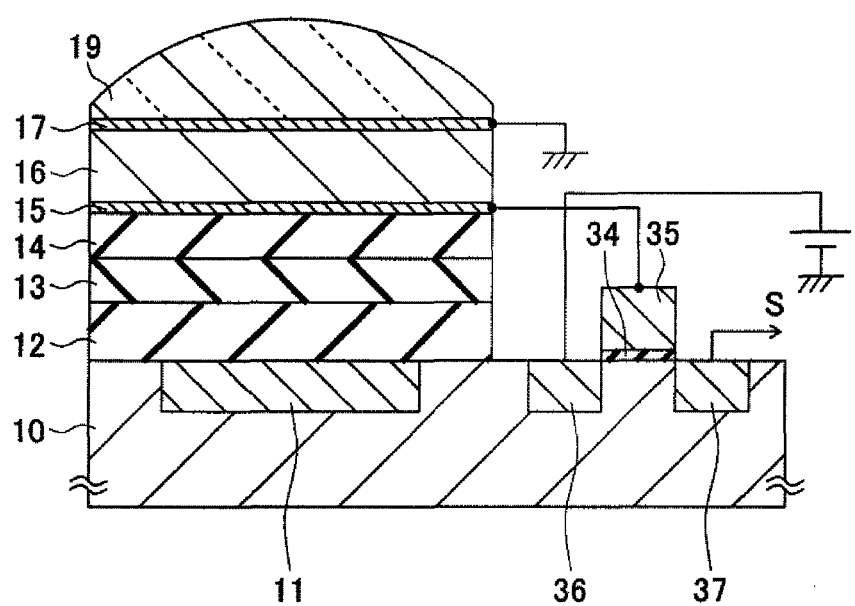
FIG. 21 is a schematic cross-sectional view of a solid-state image capturing device according to a seventh embodiment of the present invention.

FIG. 21 is a schematic cross-sectional view of a solid-state image capturing device according to a seventh embodiment of the present invention.

The solid-state image capturing device according to the seventh embodiment is substantially similar to the solid-state image capturing device according to the first embodiment except that it is devoid of the resetting unit of the first embodiment.

With the solid-state image capturing device according to the seventh embodiment, the light transmittance of the photochromic film 16 varies depending on the amount of light applied thereto such that the light transmittance is lower as the intensity of applied light is higher and is higher as the intensity of applied light is lower. Therefore, a higher amount of applied light is required to saturate the output signal generated by the photodiode 11, allowing the photodiode 11 to have an expanded dynamic range at a higher light intensity level.

If the amount of electric charges converted from the light absorbed by the photochromic film 16 is sufficiently responsive to changes in the intensity of the applied light, then it is not necessary to reset the electric charges. Since the converted electric charges are rarely saturated with low-frequency signal components, if the photochromic film is designed not to be saturated with low-frequency signal components, then the resetting transistor is not needed.

If the resetting transistor is dispensed with, then the area taken up by the solid-state image capturing device and the electric power consumed by the solid-state image capturing device are reduced.

Furthermore, if the relationship between the amount of light applied to the photochromic film 16 and the light transmittance thereof is already known, then the gate insulating film 34, the gate electrode 35, and the sourcedrains 36, 37 shown in FIG. 21 may be dispensed with.

<Eighth Embodiment>
[Arrangement of Solid-state Image Capturing Device]

Figure 22:
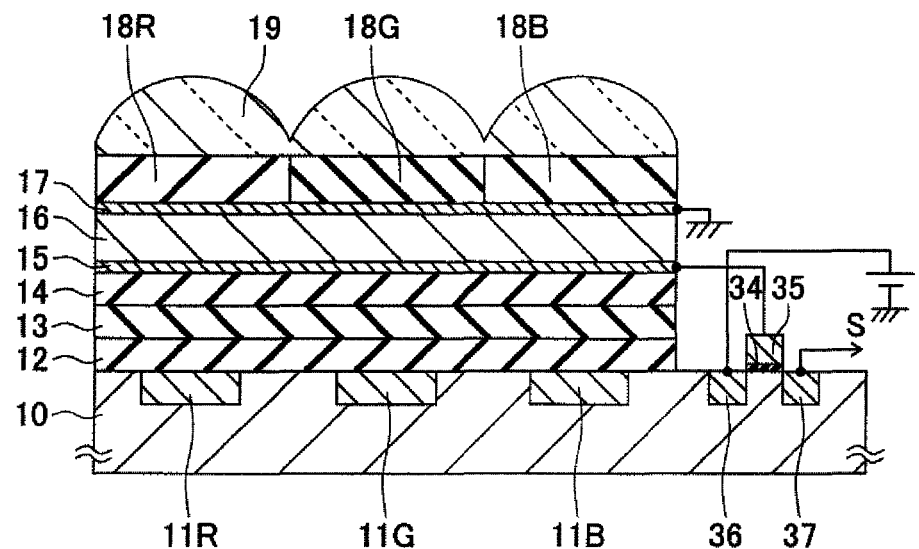
FIG. 22 is a schematic cross-sectional view of a solid-state image capturing device according to an eighth embodiment of the present invention.

FIG. 22 is a schematic cross-sectional view of a solid-state image capturing device according to an eighth embodiment of the present invention.

The solid-state image capturing device according to the eighth embodiment is substantially similar to the solid-state image capturing device according to the second embodiment except that it is devoid of the resetting unit of the second embodiment.

With the solid-state image capturing device according to the eighth embodiment, the light transmittance of the photochromic film 16 varies depending on the amount of light applied thereto such that the light transmittance is lower as the intensity of applied light is higher and is higher as the intensity of applied light is lower. Therefore, a higher amount of applied light is required to saturate the output signals generated by the photodiodes 11R, 11G, 11B, allowing the photodiodes 11R, 11G, 11B to have an expanded dynamic range at a higher light intensity level.

If the amount of electric charges converted from the light absorbed by the photochromic film 16 is sufficiently responsive to changes in the intensity of the applied light, then it is not necessary to reset the electric charges. Since the converted electric charges are rarely saturated with low-frequency signal components, if the photochromic film is designed not to be saturated with low-frequency signal components, then the resetting transistor is not needed.

If the resetting transistor is dispensed with, then the area taken up by the solid-state image capturing device and the electric power consumed by the solid-state image capturing device are reduced.

Furthermore, if the relationship between the amount of light applied to the photochromic film 16 and the light transmittance thereof is already known, then the gate insulating film 34, the gate electrode 35, and the sourcedrains 36, 37 shown in FIG. 22 may be dispensed with.

<Ninth Embodiment>
[Arrangement of Solid-state Image Capturing Device]

Figure 23:
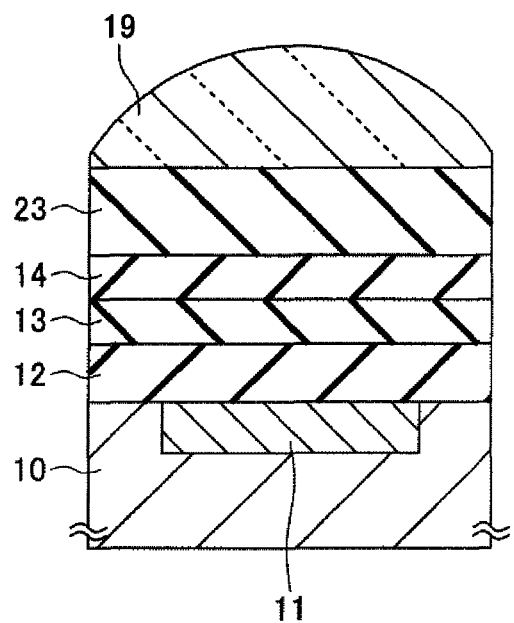
FIG. 23 is a schematic cross-sectional view of a solid-state image capturing device according to a ninth embodiment of the present invention.

FIG. 23 is a schematic cross-sectional view of a solid-state image capturing device according to a ninth embodiment of the present invention.

The solid-state image capturing device according to the ninth embodiment is substantially similar to the solid-state image capturing device according to the first embodiment except that it is devoid of the lower electrode, the upper electrode, and the light amount measuring unit of the first embodiment.

According to the ninth embodiment, the solid-state image capturing device includes a matrix of pixels disposed on a semiconductor substrate 10, providing a photosensitive surface. Each of the pixels on the photosensitive surface has a photodiode 11 as a photoelectric converter. In FIG. 23, only one pixel is illustrated.

The photosensitive surface provided on the semiconductor substrate 10 by the photodiode 11 is covered with a first insulating film 12 made of silicon oxide, silicon nitride, or resin, or stacked layers of silicon oxide, silicon nitride, and resin, for example.

The first insulating film 12 is covered with a second insulating film 13 made of silicon oxide nitride, for example.

The second insulating film 13 is covered with a third insulating film 14 made of silicon nitride, for example.

The third insulating film 14 is covered with a photochromic film 23 in a region of the photosensitive surface which includes at least some of the pixels.

The photochromic film 23 is disposed in a light path through which light is applied to the photodiode 11. The photochromic film 23 is made of a photochromic material whose light transmittance varies depending on the intensity of applied light in a predetermined wavelength range. The photochromic film 23 may include an insulating film.

An on-chip lens 19 is disposed on the photochromic film 23.

The solid-state image capturing device according to the ninth embodiment does not monitor photoelectrons generated by the photochromic film 23.

With the solid-state image capturing device according to the ninth embodiment, the light transmittance of the photochromic film 23 varies depending on the amount of light applied thereto such that the light transmittance is lower as the intensity of applied light is higher and is higher as the intensity of applied light is lower. Therefore, a higher amount of applied light is required to saturate the output signals generated by the photodiode 11, allowing the photodiode 11 to have an expanded dynamic range at a higher light intensity level.

[Method of Manufacturing the Solid-state Image Capturing Device]

A method of manufacturing the solid-state image capturing device according to the ninth embodiment will be described below.

Figure 24A:
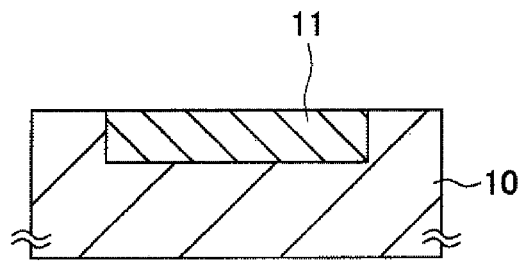
FIGS. 24A through 24C are schematic cross-sectional views showing steps of a method of manufacturing the solid-state image capturing device according to the ninth embodiment of the present invention.
Figure 24B:
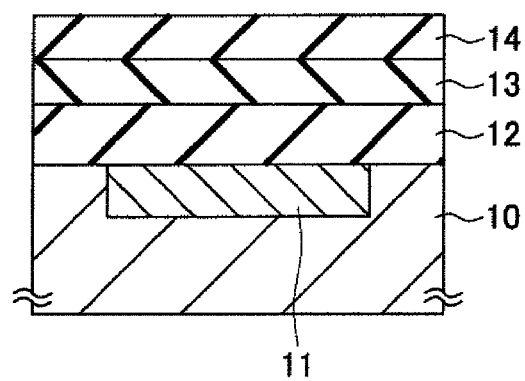
Figure 24C:
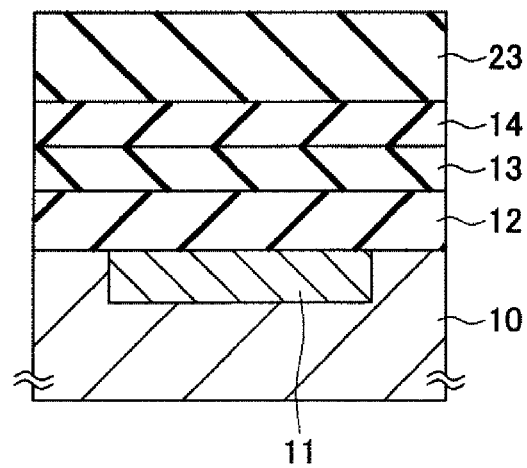

FIGS. 24A through 24C are schematic cross-sectional views showing steps of the method of manufacturing the solid-state image capturing device according to the ninth embodiment of the present invention.

As shown in FIG. 24A, an electrically conductive impurity is introduced by way of ion implantation into selected regions of the semiconductor substrate 10 to form a plurality of diodes 11 therein that are arranged as a matrix of pixels.

Then, as shown in FIG. 24B, the photosensitive surface provided on the semiconductor substrate 10 by each of the photodiode 11 is covered with a first insulating film 12, a second insulating film 13, and a third insulating film 14 by CVD, for example.

Then, as shown in FIG. 24C, the lower electrode 15 is covered with a photochromic film 23 by CVD, for example.

Thereafter, an on-chip lens 19 is formed on the photochromic film 23.

According to the ninth embodiment, as described above, since the photochromic film 16 is made of a photochromic material whose light transmittance half-value period is shorter than one frame of the solid-state image capturing device, the solid-state image capturing device has an expanded dynamic range and can generate images free of oddities.

<Tenth Embodiment>
[Arrangement of Solid-state Image Capturing Device]

Figure 25:
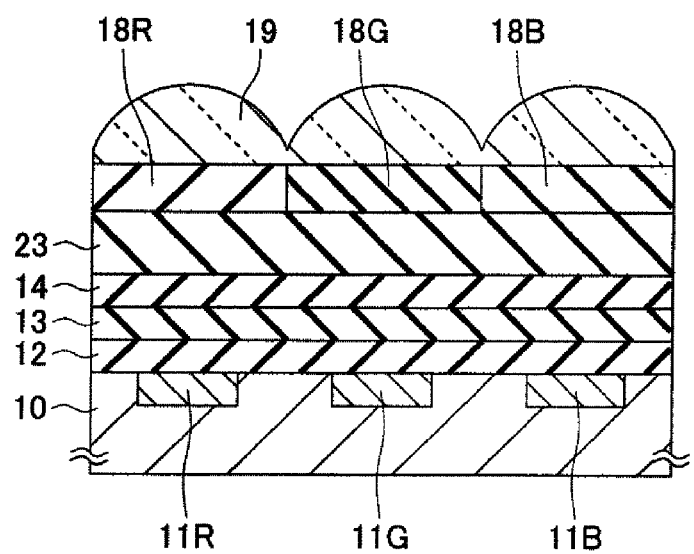
FIG. 25 is a schematic cross-sectional view of a solid-state image capturing device according to a tenth embodiment of the present invention.

FIG. 25 is a schematic cross-sectional view of a solid-state image capturing device according to a tenth embodiment of the present invention.

The solid-state image capturing device according to the tenth embodiment is substantially similar to the solid-state image capturing device according to the second embodiment except that it is devoid of the lower electrode, the upper electrode, and the light amount measuring unit of the second embodiment.

The solid-state image capturing device according to the tenth embodiment has a matrix of sets of pixels including red, green, and blue pixels.

In each set, a photodiode 11R serving as a photoelectric converter of the red pixel is disposed in the semiconductor substrate 10, and a red color filter 18R is disposed on the photochromic film 23 in combination with the red pixel.

A photodiode 11G serving as a photoelectric converter of the green pixel is disposed in the semiconductor substrate 10, and a green color filter 18G is disposed on the photochromic film 23 in combination with the green pixel.

A photodiode 11B serving as a photoelectric converter of the blue pixel is disposed in the semiconductor substrate 10, and a blue color filter 18B is disposed on the photochromic film 23 in combination with the blue pixel.

The photochromic film 23 is shared by the red, green, and blue pixels.

With the solid-state image capturing device according to the tenth embodiment, the light transmittance of the photochromic film 23 varies depending on the amount of light applied thereto such that the light transmittance is lower as the intensity of applied light is higher and is higher as the intensity of applied light is lower. Therefore, a higher amount of applied light is required to saturate the output signals generated by the photodiode 11, allowing the photodiode 11 to have an expanded dynamic range at a higher light intensity level.

<Eleventh Embodiment>
[Arrangement of Solid-state Image Capturing Device]

Figure 26:
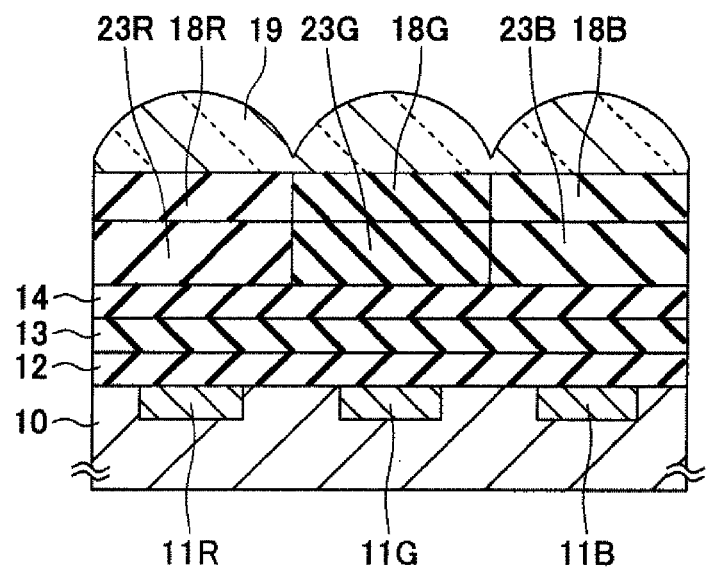
FIG. 26 is a schematic cross-sectional view of a solid-state image capturing device according to an eleventh embodiment of the present invention.

FIG. 26 is a schematic cross-sectional view of a solid-state image capturing device according to an eleventh embodiment of the present invention.

The solid-state image capturing device according to the eleventh embodiment is substantially similar to the solid-state image capturing device according to the tenth embodiment except that it has different photochromic films made of different materials corresponding respectively to red, green, and blue pixels in each set.

The red pixel is combined with a photochromic film 23R having light absorbing characteristics corresponding to the wavelength range of the red pixel.

The green pixel is combined with a photochromic film 23G having light absorbing characteristics corresponding to the wavelength range of the green pixel.

The blue pixel is combined with a photochromic film 23B having light absorbing characteristics corresponding to the wavelength range of the blue pixel.

With the solid-state image capturing device according to the eleventh embodiment, the light transmittance of the photochromic films 23R, 23G, 23B varies depending on the amount of light applied thereto such that the light transmittance is lower as the intensity of applied light is higher and is higher as the intensity of applied light is lower. Therefore, a higher amount of applied light is required to saturate the output signals generated by the photodiodes 11R, 11G, 11B, allowing the photodiodes 11R, 11G, 11B to have an expanded dynamic range at a higher light intensity level.

[Method of Manufacturing the Solid-state Image Capturing Device]

A method of manufacturing the solid-state image capturing device according to the eleventh embodiment will be described below.

FIGS. 27A through 28B are schematic cross-sectional views showing steps of the method of manufacturing the solid-state image capturing device according to the eleventh embodiment of the present invention.

Figure 27A:
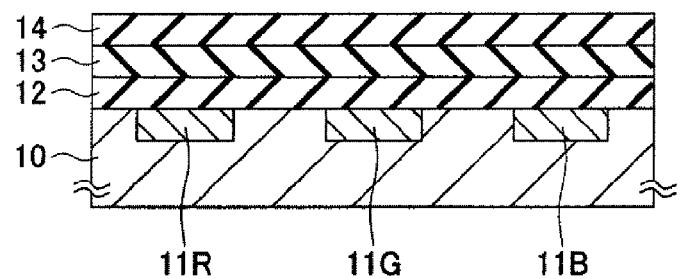
FIGS. 27A and 27B are schematic cross-sectional views showing steps of a method of manufacturing the solid-state image capturing device according to the eleventh embodiment of the present invention.

As shown in FIG. 27A, an electrically conductive impurity is introduced by way of ion implantation into selected regions of the semiconductor substrate 10 to form diodes 11R, 11G, 11B therein that are arranged as a matrix of red, green, and blue pixels.

Then, the photosensitive surface provided on the semiconductor substrate 10 by each of the photodiodes 11R, 11G, 11B is covered with a first insulating film 12, a second insulating film 13, and a third insulating film 14 by CVD, for example.

Figure 27B:
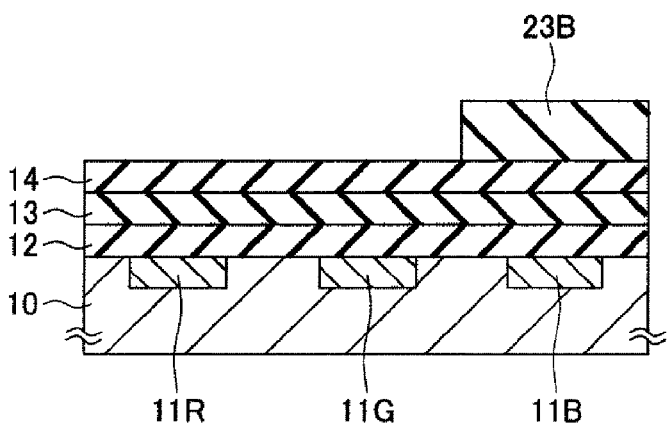

Then, as shown in FIG. 27B, a photochromic film 23B is deposited on the entire surface of the third insulating film 14 by CVD, for example. Then, a patterned resist film is deposited on the photochromic film 23B to protect a region where the blue pixel is to be formed, and then the entire surface is etched by the RIE process to remove the photochromic film 23B except the region where the blue pixel is to be formed.

Figure 28A:
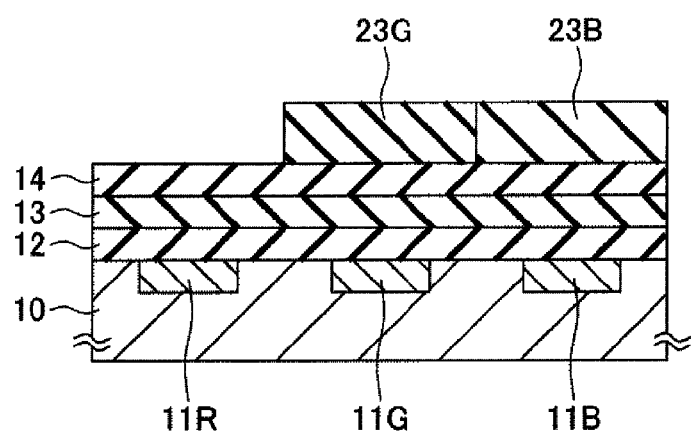
FIGS. 28A and 28B are schematic cross-sectional views showing steps of the method of manufacturing the solid-state image capturing device according to the eleventh embodiment of the present invention.

Then, as shown in FIG. 28A, a photochromic film 23G is deposited on the surface of the third insulating film 14 by CVD, for example. Then, a patterned resist film is deposited on the photochromic film 23G to protect a region where the green pixel is to be formed, and then the entire surface is etched by the RIE process to remove the photochromic film 23G except the region where the green pixel is to be formed.

Figure 28B:
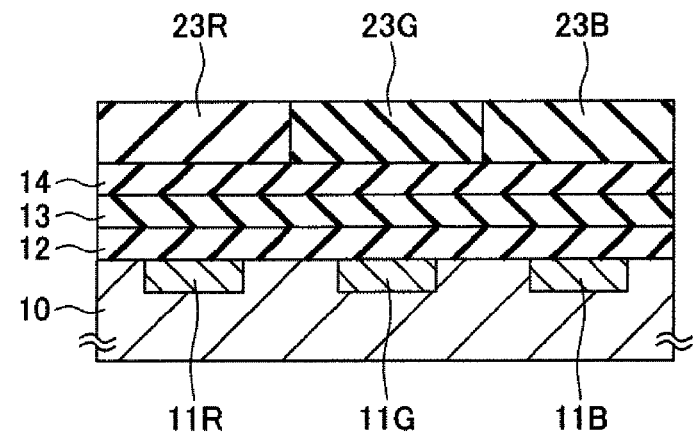

Then, as shown in FIG. 28B, a photochromic film 23R is deposited on the surface of the third insulating film 14 by CVD, for example. Then, a patterned resist film is deposited on the photochromic film 23R to protect a region where the red pixel is to be formed, and then the entire surface is etched by the RIE process to remove the photochromic film 23R except the region where the red pixel is to be formed.

Each of the photochromic materials of the photochromic films 23R, 23G, 23B may be hexarylbisimidazole derivative, for example. By changing the substituent group of the hexarylbisimidazole derivative, each of the photochromic films 23R, 23G, 23B may have an appropriate wavelength absorption range and response speed.

Thereafter, color filters 18R, 18G, 18B are formed respectively on the photochromic films 23R, 23G, 23B, and then on-chip lenses 19 are formed respectively on the color filters 18R, 18G, 18B.

In the eleventh embodiment, the photochromic film 23B, the photochromic film 23G, and the photochromic film 23R are grown and patterned in the order named. However, the order in which they are grown and patterns may be changed as desired.

As each of the photochromic films 23R, 23G, 23B is made of a photochromic film whose light transmittance half-value period is shorter than one frame, the solid-state image capturing device can generate images free from oddities in a wide dynamic range.

<Twelfth Embodiment>
[Arrangement of Solid-state Image Capturing Device]

Figure 29:
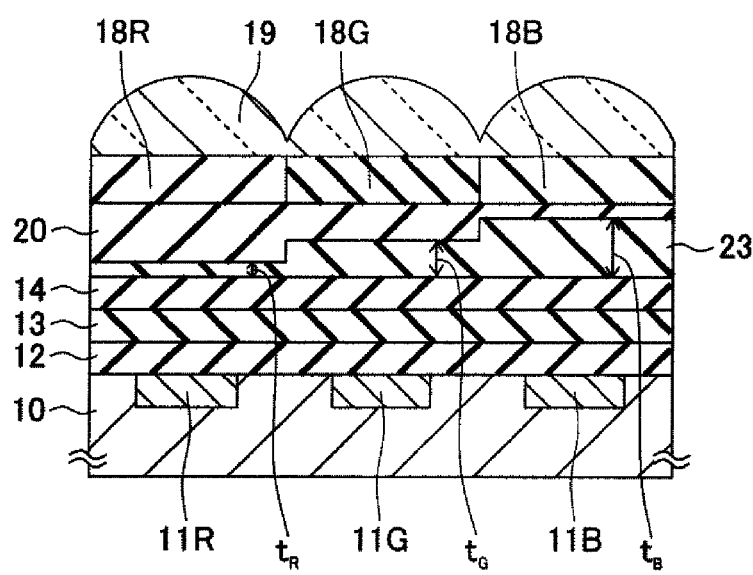
FIG. 29 is a schematic cross-sectional view of a solid-state image capturing device according to a twelfth embodiment of the present invention.

FIG. 29 is a schematic cross-sectional view of a solid-state image capturing device according to a twelfth embodiment of the present invention.

The solid-state image capturing device according to the twelfth embodiment is substantially similar to the solid-state image capturing device according to the tenth embodiment except that it has a photochromic film 23 made of one material and having different film thicknesses corresponding respectively to red, green, and blue pixels in each set.

The photochromic film 23 has a film thickness $t_R$ combined with the red pixel and selected to provide light absorbing characteristics corresponding to the wavelength range of the red pixel.

The photochromic film 23 also has a film thickness $t_G$ combined with the green pixel and selected to provide light absorbing characteristics corresponding to the wavelength range of the green pixel.

The photochromic film 23 also has a film thickness $t_B$ combined with the blue pixel and selected to provide light absorbing characteristics corresponding to the wavelength range of the blue pixel.

The photochromic film 23 is covered with a planarizing film 20 which planarizes the steps of the photochromic film 23 that are formed by the different film thicknesses thereof.

With the solid-state image capturing device according to the twelfth embodiment, the light transmittance of the photochromic film 23 varies depending on the amount of light applied thereto such that the light transmittance is lower as the intensity of applied light is higher and is higher as the intensity of applied light is lower. Therefore, a higher amount of applied light is required to saturate the output signal generated by the photodiodes 11R, 11G, 11B, allowing the photodiodes 11R, 11G, 11B to have an expanded dynamic range at a higher light intensity level.

[Method of Manufacturing the Solid-state Image Capturing Device]

A method of manufacturing the solid-state image capturing device according to the twelfth embodiment will be described below.

FIGS. 30A through 31B are schematic cross-sectional views showing steps of the method of manufacturing the solid-state image capturing device according to the twelfth embodiment of the present invention.

Figure 30A:
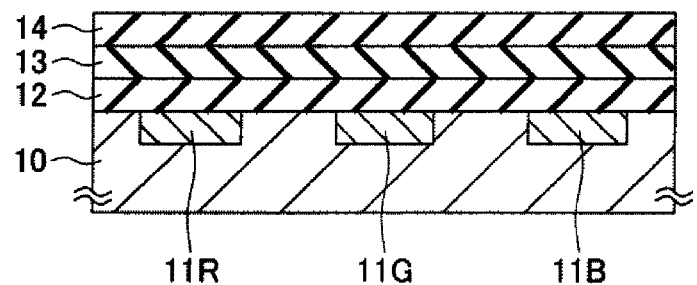
FIGS. 30A through 30C are schematic cross-sectional views showing steps of a method of manufacturing the solid-state image capturing device according to the twelfth embodiment of the present invention.

As shown in FIG. 30A, an electrically conductive impurity is introduced by way of ion implantation into selected regions of the semiconductor substrate 10 to form diodes 11R, 11G, 11B therein that are arranged as a matrix of red, green, and blue pixels.

Then, the photosensitive surface provided on the semiconductor substrate 10 by each of the photodiodes 11R, 11G, 11B is covered with a first insulating film 12, a second insulating film 13, and a third insulating film 14 by CVD, for example.

Figure 30B:
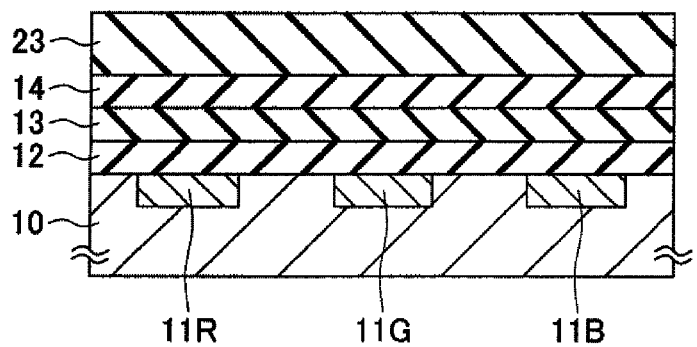

Then, as shown in FIG. 30B, a photochromic film 23 is deposited on the entire surface of the third insulating film 14 by CVD, for example.

Figure 30C:
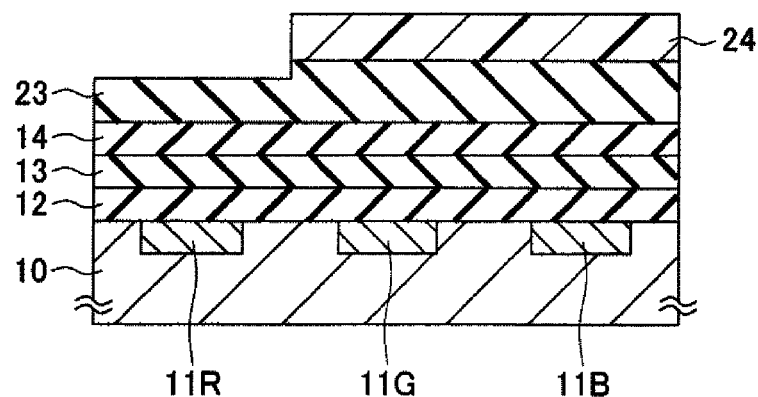

Then, as shown in FIG. 30C, a patterned resist film 24 for providing an opening in which to form a region where the red pixel is to be formed is deposited, and then the entire surface is etched by an RIE process to reduce the film thickness of the photochromic film 16 in the region where the red pixel is to be formed.

Figure 31A:
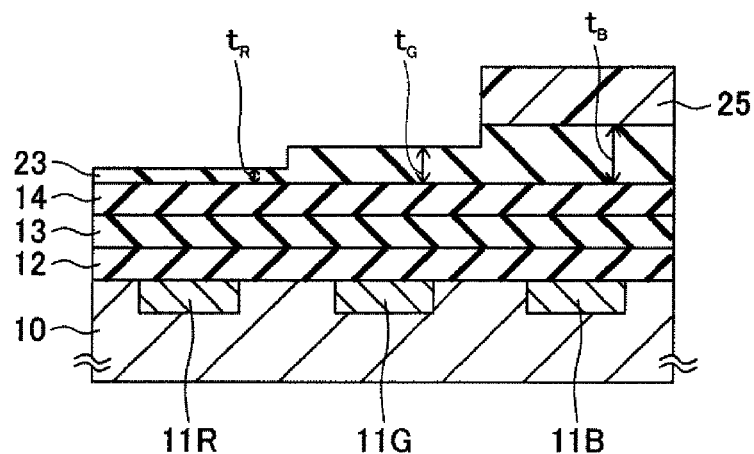
FIGS. 31A and 31B are schematic cross-sectional views showing steps of the method of manufacturing the solid-state image capturing device according to the twelfth embodiment of the present invention.

Then, as shown in FIG. 31A, a patterned resist film 25 for providing openings in which to form regions where the red and green pixels are to be formed is deposited, and then the entire surface is etched by an RIE process to reduce the film thickness of the photochromic film 23 in the regions where the red and green pixels is to be formed.

According to the above etching processes, the photochromic film 23 has a film thickness $t_R$ in the red pixel, a film thickness $t_G$ in the green pixel, and a film thickness $t_B$ in the blue pixel. The film thickness $t_R$ in the red pixel is achieved by the two etching processes.

Figure 31B:
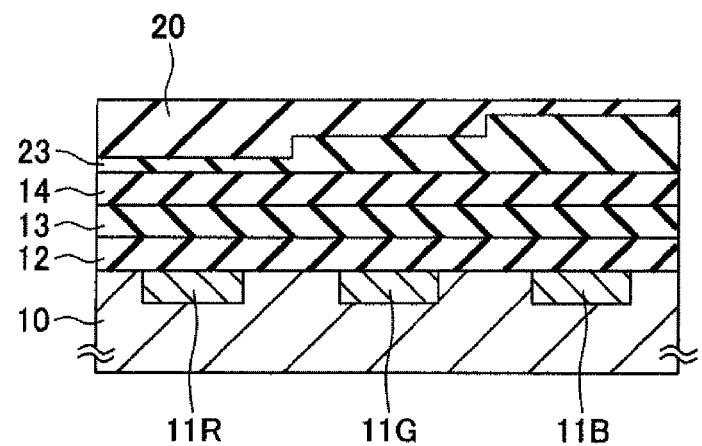

Then, as shown in FIG. 31B, the photochromic film 23 is coated with a resin to form a planarizing film 20.

On-chip lenses 19 are then formed on the planarizing film 20.

In the twelfth embodiment, the above fabrication process is employed because the film thickness $t_R$ of the photochromic film 16 is the smallest and the film thickness $t_B$ of the photochromic film 16 is the greatest. However, the fabrication process may be modified depending on the order in which the different film thicknesses are to be produced. The smallest film thickness may be achieved by the two etching processes.

As the photochromic film 23 is made of a photochromic film whose light transmittance half-value period is shorter than one frame, the solid-state image capturing device can generate images free from oddities in a wide dynamic range.

<Thirteenth Embodiment>
[Arrangement of Solid-state Image Capturing Device]

Figure 32:
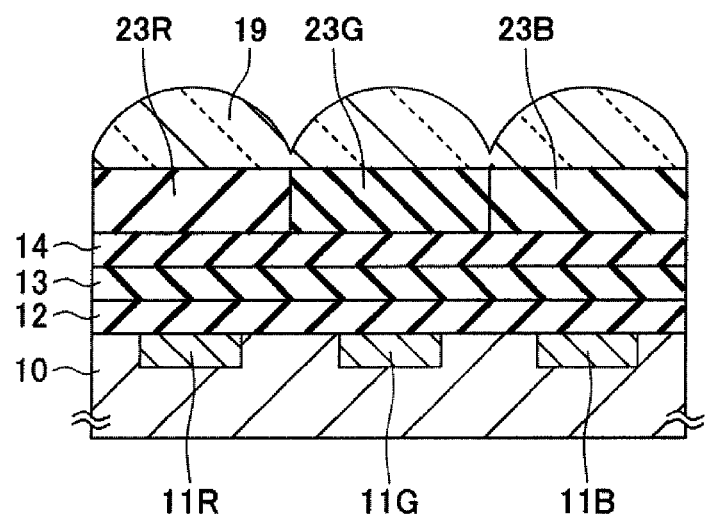
FIG. 32 is a schematic cross-sectional view of a solid-state image capturing device according to a thirteenth embodiment of the present invention.

FIG. 32 is a schematic cross-sectional view of a solid-state image capturing device according to a thirteenth embodiment of the present invention.

The solid-state image capturing device according to the thirteenth embodiment is substantially similar to the solid-state image capturing device according to the tenth embodiment except that it has photochromic films doubling as color filters.

The red pixel is combined with a photochromic film 23R having light absorbing characteristics corresponding to the wavelength range of the red pixel, and doubling as a red color filter.

The green pixel is combined with a photochromic film 23G having light absorbing characteristics corresponding to the wavelength range of the green pixel, and doubling as a green color filter.

The blue pixel is combined with a photochromic film 23B having light absorbing characteristics corresponding to the wavelength range of the blue pixel, and doubling as a blue color filter.

With the solid-state image capturing device according to the thirteenth embodiment, the light transmittance of the photochromic films 23R, 23G, 23B varies depending on the amount of light applied thereto such that the light transmittance is lower as the intensity of applied light is higher and is higher as the intensity of applied light is lower. Therefore, a higher amount of applied light is required to saturate the output signal generated by the photodiodes 11R, 11G, 11B, allowing the photodiodes 11R, 11G, 11B to have an expanded dynamic range at a higher light intensity level.

<Fourteenth Embodiment>
[Applied to an Electronic Device]

Figure 33:
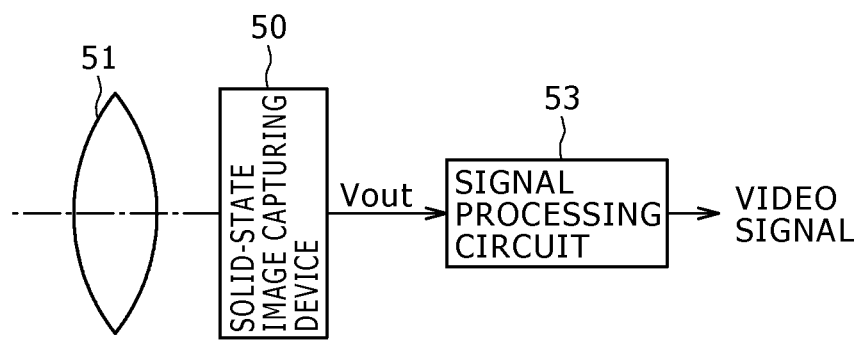
FIG. 33 is a schematic cross-sectional view of an electronic device according to a fourteenth embodiment of the present invention.

FIG. 33 is a schematic cross-sectional view of an electronic device according to a fourteenth embodiment of the present invention. The electronic device according to the fourteenth embodiment includes an electronic video device which is capable of capturing still images or moving images.

As shown in FIG. 33, the electronic device includes an image sensor (solid-state image capturing device) 50, an optical system 51, and a signal processing circuit 53.

According to the fourteenth embodiment, the image sensor 50 includes the solid-state image capturing device according to the first embodiment described above.

The optical system 51 focuses image light (incident light) from a subject onto an image capturing surface of the image sensor 50, storing signal charges in the image sensor 50 for a certain period of time. The stored signal charges are then read as an output signal Vout from the image sensor 50 to the signal processing circuit 53.

The optical system 51 is combined with a shutter device for controlling a period during which light is applied through the optical system 51 to the image sensor 50 and a period during which the applied light is blocked.

The electronic device also includes an image processor which supplies a drive signal (timing signal) for controlling the charge transfer in the image sensor 50 and a drive signal for controlling the operation of the shutter device. The drive signal (timing signal) supplied to the image sensor 50 transfers the stored signal charges in the image sensor 50. The signal processing circuit 53 performs various signal processing processes on the output signal Vout from the image sensor 50 to generate a video signal. The signal processing circuit 53 outputs the video signal to a storage medium such as a memory or a video monitor or both.

According to the fourteenth embodiment, the solid-state image capturing device is applied to the image sensor 50 which includes a matrix of pixels for detecting signal charges depending on the amount of applied visible light as a physical quantity. However, the solid-state image capturing device is not limited to an image sensor, but is also applicable to a column-type solid-state image capturing device having column circuits associated with respective pixel columns of a pixel array.

The present invention is not limited to solid-state image capturing devices which detect a distribution of amounts of applied visible light and capture the detected distribution as an image. The present invention is also applicable to various solid-state image capturing devices for capturing an image representative of a distribution of amounts of applied infrared radiation, X-rays, or particles, or all types of solid-state image capturing devices (physical quantity distribution detecting devices), such as a fingerprint sensor, which detect a distribution of amounts of other physical quantities including pressures, electrostatic capacitances, etc., and capture the detected distribution as an image.

The present invention is not limited to solid-state image capturing devices in general, but is also applicable to electronic devices having an image capturing function, such as electronic digital still devices, electronic video devices, cellular phones, etc. A module configuration incorporated in an electronic device, i.e., an electronic device module, may be used as an image capturing device.

An image capturing device such as an electronic device module which may be designed as a mobile device such as an electronic video device, an electronic digital still devices, a cellular phone, or the like may include a solid-state image capturing device. The image sensor 50 according to the fourteenth embodiment may be used as such a solid-state image capturing device.

The principles of the present invention may be applied to a CMOS sensor and a CCD device in each of the above embodiments.

Although certain preferred embodiments of the present invention have been shown and described in detail, it should be understood that various changes and modifications may be made therein without departing from the scope of the appended claims.

The present application contains subject matter related to that disclosed in Japanese Priority Patent Application JP 2010-084035 filed in the Japan Patent Office on Mar. 31, 2010, the entire content of which is hereby incorporated by reference.

It should be understood by those skilled in the art that various modifications, combinations, sub-combinations and alternations may occur depending on design requirements and other factors insofar as they are within the scope of the appended claims or the equivalent thereof.

What is claimed is:

1. A method comprising:
   forming a semiconductor substrate having a photosensitive surface including a plurality of pixels with respective photoelectric converters; and
   forming a photochromic film disposed in a light path through which light is applied to each of the photoelectric converters, the photochromic film being made of a photochromic material having a light transmittance that varies depending on an intensity of applied light in a predetermined wavelength range,
   wherein,
      the light transmittance has a half-value period shorter than one frame during which pixel signals generated by the plurality of pixels are read from all of the plurality of pixels.

2. The method of claim 1, further comprising providing a light amount measuring unit configured to measure an amount of light absorbed by the photochromic film.

3. The method of claim 2, further comprising providing a signal processor configured to combine a light signal representative of the amount of light measured by the light amount measuring unit and light signals generated by the photoelectric converters into pixel signals from the pixels.

4. The method of claim 2, further comprising providing a resetting unit configured to reset a light signal which is generated by the photochromic film when the photochromic film absorbs the applied light.

5. The method of claim 1, wherein the plurality of pixels include red pixels, green pixels, and blue pixels, further including:
   color filters configured to pass light in wavelength ranges of red, green, and blue, the color filters being disposed on the semiconductor substrate in respective light paths leading to the photoelectric converters of the red pixels, the green pixels, and the blue pixels.

6. The method of claim 5, wherein the photochromic film comprises different materials disposed in alignment with the color filters, respectively, depending on the wavelength ranges.

7. The method of claim 5, wherein the photochromic film is made of one material irrespective of the wavelength ranges.

8. The method of claim 5, wherein the photochromic film is configured to function as color filters.

9. The method of claim 1, wherein the light transmittance of the photochromic film varies depending on the intensity of applied light in a visible range.

10. The method of claim 1, wherein the light transmittance of the photochromic film is higher as the intensity of applied light in a visible range is lower and is lower as the intensity of applied light in the visible range is higher.

11. The method of claim 1, wherein the light transmittance of said photochromic film is that continuously variable depending on the intensity of applied light in a visible range.

12. A method comprising:
forming a semiconductor substrate having a photosensitive surface including a plurality of pixels with respective photoelectric converters; and
forming a photochromic film disposed in a light path through which light is applied to each of the photoelectric converters, the photochromic film comprising a photochromic material having a light transmittance that varies depending on an intensity of applied light in a predetermined wavelength range,
wherein,
the light transmittance has a half-value period shorter than one frame during which pixel signals generated by the plurality of pixels are read from all of the plurality of pixels, and
the photochromic material includes a hexarylbisimidazole derivative.

13. The method of claim 1, wherein the plurality of pixels include a set comprising one red pixel, two green pixels, and one blue pixel, the photochromic film being shared by the set.

14. The method of claim 1, wherein the plurality of pixels include a set comprising one column of pixels, the photochromic film being shared by the set.

15. The method of claim 1, wherein the plurality of pixels include a set comprising a plurality of columns, the photochromic film being shared by the set.

16. The method of claim 1, wherein the photochromic film is shared by all of the plurality of pixels of the photosensitive surface.

17. The method of claim 1, further comprising disposing the photochromic film over a region in which the plurality of pixels are disposed.

18. A method comprising:
forming a solid-state image capturing device including an image capturing unit by (a) forming a semiconductor substrate having a photosensitive surface including a plurality of pixels with respective photoelectric converters, and (b) forming a photochromic film disposed in a light path through which light is applied to each of the photoelectric converters, the photochromic film being made of a photochromic material having a light transmittance that varies depending on an intensity of applied light in a predetermined wavelength range;
providing an optical system configured to guide incident light to the image capturing unit of the solid-state image capturing device;
providing a signal processing circuit configured to process an output signal from the solid-state image capturing device; and
assembling the solid-state image capturing device, the optical system, and the signal processing circuit in an electronic device,
wherein,
the light transmittance has a half-value period shorter than one frame during which pixel signals generated by the plurality of pixels are read from all of the plurality of pixels.

19. The method of claim 18, further comprising:
forming a first electrode; and
forming a second electrode,
wherein,
the photochromic film is between the first electrode and the second electrode.

\* \* \* \* \*